US011907141B1

(12) United States Patent
Suh et al.

(10) Patent No.: US 11,907,141 B1
(45) Date of Patent: Feb. 20, 2024

(54) FLEXIBLE DUAL RANKS MEMORY SYSTEM TO BOOST PERFORMANCE

(71) Applicant: QUALCOMM Incorporated, San Diego, CA (US)

(72) Inventors: Jungwon Suh, San Diego, CA (US); Pankaj Deshmukh, San Diego, CA (US); Shyamkumar Thoziyoor, San Diego, CA (US); Subbarao Palacharla, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/929,946

(22) Filed: Sep. 6, 2022

(51) Int. Cl.
*G06F 13/16* (2006.01)
*G06F 12/06* (2006.01)

(52) U.S. Cl.
CPC ...... *G06F 13/1694* (2013.01); *G06F 12/0623* (2013.01)

(58) Field of Classification Search
CPC .......................... G06F 13/1694; G06F 12/0623
See application file for complete search history.

(56) References Cited

U.S. PATENT DOCUMENTS

| | | | | |
|---|---|---|---|---|
| 8,264,903 B1* | 9/2012 | Lee | ......................... | G11C 5/04 365/194 |
| 2009/0177853 A1* | 7/2009 | Mazzola | ................. | G06F 12/06 711/158 |
| 2011/0302366 A1* | 12/2011 | Peterson | ............ | G06F 12/0623 711/E12.001 |
| 2012/0079183 A1* | 3/2012 | Bains | ................ | G11C 11/40618 711/E12.007 |
| 2017/0162235 A1* | 6/2017 | De | ....................... | G06F 12/0607 |
| 2017/0262367 A1* | 9/2017 | Chun | ................... | G11C 7/1075 |
| 2018/0096719 A1* | 4/2018 | Tomishima | ............ | G11C 29/48 |
| 2020/0027499 A1* | 1/2020 | Balakrishnan | .... | G11C 11/40618 |
| 2020/0357457 A1* | 11/2020 | Xin | .................... | G11C 11/40603 |
| 2021/0201966 A1* | 7/2021 | Gibbons | .............. | G11C 7/1084 |
| 2021/0216401 A1* | 7/2021 | Meaney | .............. | G06F 9/30047 |
| 2022/0172771 A1* | 6/2022 | Wiscombe | .......... | G11C 11/4085 |
| 2022/0254408 A1* | 8/2022 | Wigton | ............... | G11C 11/4093 |
| 2023/0178121 A1* | 6/2023 | Nygren | .................. | G11C 7/222 365/189.05 |

OTHER PUBLICATIONS

International Search Report and Written Opinion—PCT/US2023/028095—ISA/EPO—dated Oct. 25, 2023. 16 pages.

* cited by examiner

*Primary Examiner* — Tracy A Warren
(74) *Attorney, Agent, or Firm* — The Marbury Law Group/Qualcomm

(57) ABSTRACT

Various embodiments include methods for implementing flexible ranks in a memory system. Embodiments may include receiving, at a memory controller, a first memory access command and a first address at which to implement the first memory access command in a logical rank, generating, by the memory controller, a first signal configured to indicate to a first memory device of the logical rank to implement the first memory access command via a first partial channel, sending, from the memory controller, the first signal to the first memory device, generating, by the memory controller, a second signal configured to indicate to a second memory device of the logical rank that is different from the first memory device to implement the first memory access command via a second partial channel, and sending, from the memory controller, the second signal to the second memory device.

27 Claims, 14 Drawing Sheets

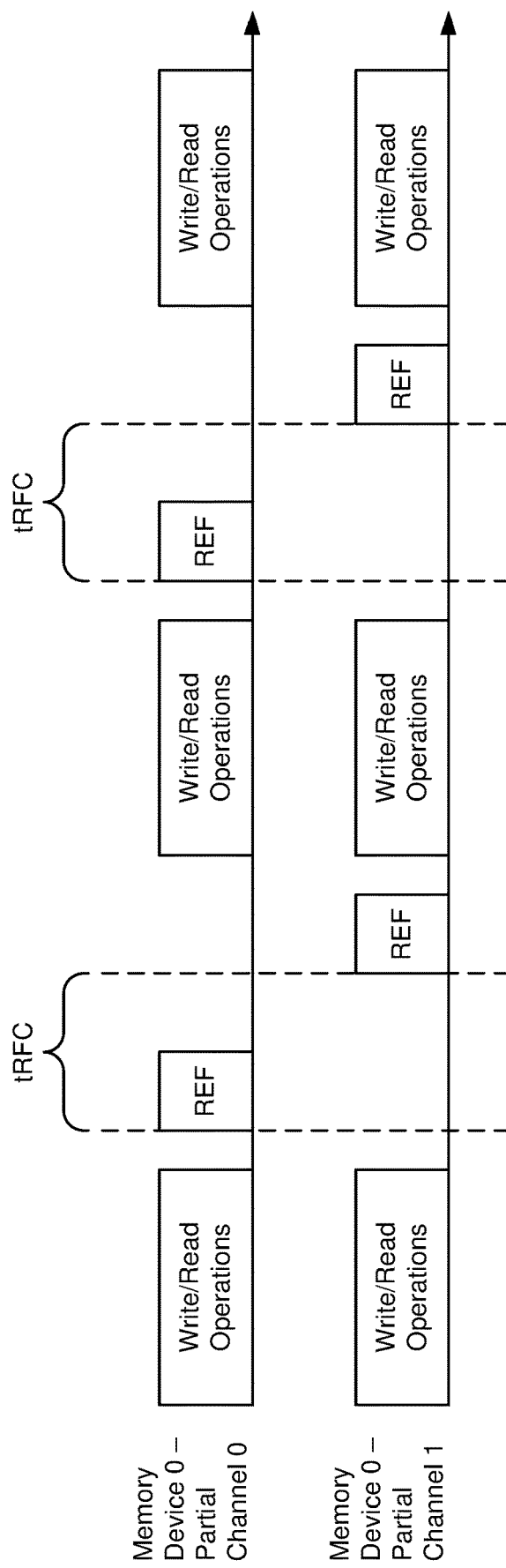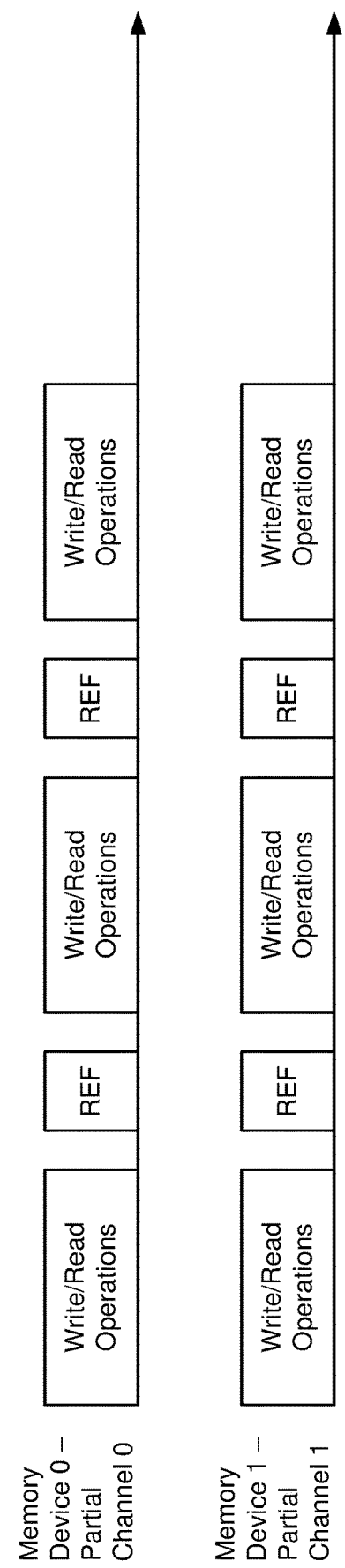

1100

1102
Generate Signals To Activate First Partial Channel Of First Memory Device Of Rank And Second Partial Channel Of First Memory Device Of Rank

1104
Send Signals To Activate First Partial Channel Of First Memory Device Of Rank And Second Partial Channel Of First Memory Device Of Rank

1202
Generate Signals For Memory Access At First Partial Channel Of First Memory Device Of Rank And At Second Partial Channel Of First Memory Device Of Rank

1204
Send Signals For Memory Access At First Partial Channel Of First Memory Device Of Rank And At Second Partial Channel Of First Memory Device Of Rank

FIG. 12

FLEXIBLE DUAL RANKS MEMORY SYSTEM TO BOOST PERFORMANCE

BACKGROUND

Next generation low-power double data rate (LPDDR) memory (e.g., LPDDR6) can offer a balance of high performance, low power, competitive memory cost, various package types, and multi-sourcing availability that are attractive for mobile and non-mobile applications.

SUMMARY

Various aspects may include apparatuses and methods for implementing a flexible dual ranks memory system. Aspects may include receiving, at a memory controller, a first memory access command and a first address at which to implement the first memory access command in a logical rank, generating, by the memory controller, a first signal configured to indicate to a first memory device of the logical rank to implement the first memory access command via a first partial channel, sending, from the memory controller, the first signal to the first memory device, generating, by the memory controller, a second signal configured to indicate to a second memory device of the logical rank that is different from the first memory device to implement the first memory access command via a second partial channel, and sending, from the memory controller, the second signal to the second memory device.

Some aspects may further include generating, by the memory controller, a third signal configured to indicate to the first memory device to activate components of the first memory device associated with the first partial channel, sending, from the memory controller, the third signal to the first memory device, generating, by the memory controller, a fourth signal configured to indicate to the second memory device to activate components of the first memory device associated with the second partial channel, and sending, from the memory controller, the fourth signal to the second memory device.

Some aspects may further include determining whether the first address at which to implement the first memory access command in the logical rank is at the logical rank, in which generating the first signal, sending the first signal, generating the second signal, and sending the second signal occur in response to determining that the first address at which to implement the first memory access command in the logical rank is at the logical rank.

Some aspects may further include receiving, at the memory controller, a second memory access command and a second address at which to implement the second memory access command in a rank, generating, by the memory controller, a third signal configured to indicate to the first memory device of the rank to implement the second memory access command via the first partial channel, sending, from the memory controller, the third signal to the first memory device, generating, by the memory controller, a fourth signal configured to indicate to the first memory device of the rank to implement the second memory access command via the second partial channel; and sending, from the memory controller, the fourth signal to the first memory device.

Some aspects may further include determining whether the second address at which to implement the second memory access command in the rank is at a logical rank, in which generating the third signal, sending the third signal, generating the fourth signal, and sending the fourth signal occur in response to determining that the second address at which to implement the second memory access command in the rank is not at the logical rank.

Some aspects may further include receiving, at a first partial channel interface of the first memory device for the first partial channel, the first signal, implementing, via the first partial channel, the first memory access command at the first memory device, receiving, at a second partial channel interface of the second memory device for the second partial channel, the second signal, and implementing, via the second partial channel, the second memory access command at the second memory device.

In some aspects, implementing the first memory access command at the first memory device and implementing the second memory access command at the second memory device may include implementing the first memory access command at the first memory device and implementing the second memory access command at the second memory device in parallel.

Further aspects may include receiving, at a first partial channel interface of a first memory device for a first partial channel, a first refresh signal, receiving, at a second partial channel interface of a second memory device for a second partial channel, a second refresh signal, implementing, via the first partial channel, a refresh operation at the first memory device in response to the first refresh signal, and implementing, via the second partial channel, a refresh operation at the second memory device in response to the second refresh signal.

In some aspects, the first memory device and the second memory device are different memory devices of a logical rank, and implementing the refresh operation at the second memory device may include implementing the refresh operation at the second memory device in parallel with implementing the refresh operation at the first memory device.

Some aspects may further include receiving, at the first partial channel interface, a first signal configured to indicate to the first memory device of the logical rank to implement a first memory access command via the first partial channel, receiving, at the second partial channel interface, a second signal configured to indicate to the second memory device of the logical rank to implement a second memory access command via the second partial channel, implementing, via the first partial channel, the first memory access command at the first memory device following implementing the refresh operation at the second memory device in parallel with implementing the refresh operation at the first memory device, and implementing, via the second partial channel, the second memory access command at the second memory device following implementing the refresh operation at the second memory device in parallel with implementing the refresh operation at the first memory device.

In some aspects, the second memory device is the first memory device. Some aspects may further include waiting a designated refresh period for the refresh operation at the first memory device, in which implementing the refresh operation at the second memory device may include implementing the refresh operation at the second memory device following the designated refresh period.

Some aspects may further include receiving, at the first partial channel interface, a first signal configured to indicate to the first memory device to implement a first memory access command via the first partial channel, receiving, at the second partial channel interface, a second signal configured to indicate to the second memory device to implement a second memory access command via the second partial channel, implementing, via the first partial channel, the first memory access command at the first memory device following implementing the refresh operation at the second memory device following the designated refresh period, and implementing, via the second partial channel, the second memory access command at the second memory device following implementing the refresh operation at the second memory device following the designated refresh period.

Various aspects include computing devices including a first memory device, a second memory device and a memory controller communicatively connected to the first memory device and the second memory device, and configured to perform operations of any of the methods summarized above. Various aspects include computing devices having means for performing any of the functions of the methods summarized above. Various aspects include memory controllers configured to perform any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIGS. 5A and 5B are timing diagrams illustrating examples of memory access commands using rank and logical rank structures memory systems according to an embodiment.

FIG. 11 is a process flow diagram illustrating a method for activating ranks in a memory system according to some embodiments.

FIG. 12 is a process flow diagram illustrating a method for implementing memory access using ranks in a memory system according to some embodiments.

DETAILED DESCRIPTION

Figure 1:
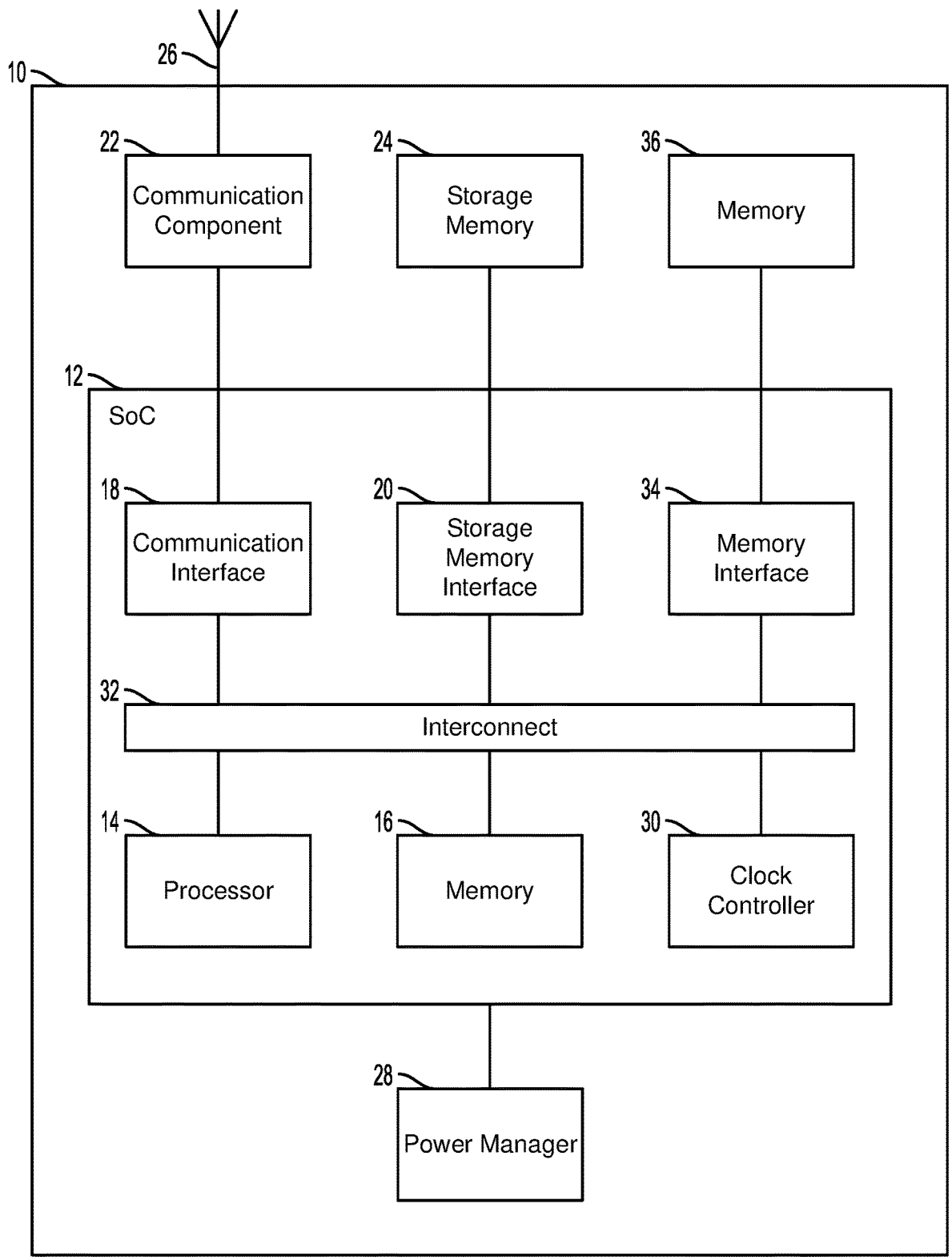
FIG. 1 is a component block diagram illustrating an example computing device suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include circuitry, methods, and computing devices implementing such methods for implementing flexible ranks in a memory system. Some embodiments include implementing logical ranks in the memory system for which a logical rank may be implemented using a partial channel of a memory device and a different partial channel of a different memory device. Some embodiments include implementing logical ranks in the memory system and ranks in the memory system for which a rank may be implemented using multiple partial channels of a memory device.

The terms "computing device" and "mobile device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor. The term "computing device" may further refer to stationary computing devices including personal computers, desktop computers, all-in-one computers, workstations, super computers, mainframe computers, embedded computers, servers, home theater computers, and game consoles.

Partial channels implemented for memory devices impose command timing constraints for access to a memory device via the partial channels, such as for a memory device included in a rank of a memory system. Various embodiments address and overcome the timing constraints for access to a memory device via the partial channels in a rank of the memory system by implementing logical ranks that enable parallel access to multiple memory devices via the partial channels. Various embodiments may organize a memory system such that logical ranks may include different partial channels of different memory devices, avoiding access conflicts to the same memory device via multiple partial channels of a rank. Logical ranks may be enabled by use of chip select signals generated at a system on chip (SoC) and sent to multiple memory devices to enable use of the different partial channels of the different memory devices in parallel. In some embodiments, ranks may also be implemented in the memory system in which logical ranks are implemented.

Some embodiments may be particularly well suited for memory subsystems and memory devices for user equipment, mobile computing, automotive, and artificial intelligence systems by providing high performance, memory systems. In particular, various embodiments may be implemented with next generation LPDDR specification (LPDDR6) and associated double data rate memory (DDR) physical layer (PHY) chipsets used in mobile device or non-mobile computing devices.

Various embodiments improve the operations of computing devices by improving the functioning of memory devices and memory subsystems by overcoming timing constraints for accessing memory device via partial channels.

FIG. 1 illustrates a system including a computing device 10 suitable for use with various embodiments. The computing device 10 may include a system-on-chip (SoC) 12 with a processor 14, a memory 16, a memory interface 34, a communication interface 18, a storage memory interface 20, a clock controller 30, and an interconnect 32. The computing device 10 may further include a communication component 22, such as a wired or wireless modem, a storage memory 24, an antenna 26 for establishing a wireless communication link, a power manager 28, and a memory 36. The processor 14 may include any of a variety of processing devices, for example a number of processor cores.

The term "system-on-chip" (SoC) is used herein to refer to a set of interconnected electronic circuits typically, but not exclusively, including a processing device, a memory, and a communication interface. A processing device may include a variety of different types of processors 14 and processor cores, such as a general purpose processor, a central processing unit (CPU), a digital signal processor (DSP), a graphics processing unit (GPU), an accelerated processing unit (APU), a secure processing unit (SPU), neural network processing unit (NPU), a subsystem processor of specific components of the computing device, such as an image processor for a camera subsystem or a display processor for a display, an auxiliary processor, a single-core processor, a multicore processor, a controller, and a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and time references. Integrated circuits may be configured such that the components of the integrated circuit reside on a single piece of semiconductor material, such as silicon.

An SoC 12 may include one or more processors 14. The computing device 10 may include more than one SoC 12, thereby increasing the number of processors 14 and processor cores. The computing device 10 may also include processors 14 that are not associated with an SoC 12. The processors 14 may each be configured for specific purposes that may be the same as or different from other processors 14 of the computing device 10. One or more of the processors 14 and processor cores of the same or different configurations may be grouped together. A group of processors 14 or processor cores may be referred to as a multi-processor cluster.

The computing device 10 may include any number and combination of memories, such as the memory 16 integral to the SoC 12 and the memory 36 separate from the SoC 12. Any of the memories 16, 36 may be a volatile or non-volatile memory configured for storing data and processor-executable code for access by the processor 14. The computing device 10 and/or SoC 12 may include one or more memories 16, 36 configured for various purposes. One or more memories 16, 36 may include volatile memories such as random access memory (RAM) or main memory, including static RAM (SRAM), such as the memory 16, dynamic RAM (DRAM), such as the memory 36, or cache memory.

The memories 16, 36 may be configured to temporarily store a limited amount of data received from a data sensor or subsystem, data and/or processor-executable code instructions that are requested from a non-volatile memory 16, 24, 36 loaded to the memories 16, 36 from the non-volatile memory 16, 24, 36 in anticipation of future access based on a variety of factors, and/or intermediary processing data and/or processor-executable code instructions produced by the processor 14 and temporarily stored for future quick access without being stored in non-volatile memory 16, 24, 36. The memory 16, 36 may be configured to store data and processor-executable code in parts of the memory 16, 36 configured to store data and processor-executable code for secure computing operations, referred to herein as a secure portion. The memory 16, 36 may be configured to store data and processor-executable code in parts of the memory 16, 36 configured to store data and processor-executable code for non-secure computing operations, referred to herein as a non-secure portion.

The memory interface 34 may work in unison with the memory 36 to enable the computing device 10 to store and retrieve data and processor-executable code on and from the memory 36. The memory interface 34 may control access to the storage memory 36 and allow the processor 14 to read data from and write data to the memory 36.

The storage memory interface 20 and the storage memory 24 may work in unison to allow the computing device 10 to store data and processor-executable code on a non-volatile storage medium. The storage memory 24 may be configured much like an embodiment of the memory 16 in which the storage memory 24 may store the data or processor-executable code for access by one or more of the processors 14. The storage memory 24, being non-volatile, may retain the information after the power of the computing device 10 has been shut off. When the power is turned back on and the computing device 10 reboots, the information stored on the storage memory 24 may be available to the computing device 10. The storage memory interface 20 may control access to the storage memory 24 and allow the processor 14 to read data from and write data to the storage memory 24.

The power manager 28 may be configured to control power states of and/or power delivery to the components of the SoC 12. In some embodiments, the power manager 28 may be configured to signal power states to the components of the SoC 12 to prompt the components of the SoC 12 to transition to the signaled power states. In some embodiments, the power manager 28 may be configured to control amounts of power provided to the components of the SoC 12. For example, the power manager 28 may be configured to control connections between components of the SoC 12 and power rails (not shown). As another example, the power manager 28 may be configured to control amounts of power on power rails connected to the components of the SoC 12.

A clock controller 30 may be configured to control clock signals transmitted to the components of the SoC 12. In some embodiments, the clock controller 30 may be configured to signal clock states, such as gated or ungated, to components of the SoC 12 to prompt the components of the SoC 12 to transition to the clock state. For example, a component of the SoC 12 may transition to a gated clock state in response to receiving a gated clock state signal from the clock controller 30 by disconnecting from a clock signal and may transition to an ungated clock state in response to receiving an ungated clock state signal from the clock controller 30 by connecting to the clock signal. In some embodiments, the clock controller 30 may be configured to control clock signals to components of the SoC 12. For example, the clock controller 30 may disconnect a component of the SoC 12 from a clock signal to transition the component of the SoC 12 to a gated clock state and may connect the component of the SoC 12 to the clock signal to transition the component of the SoC 12 to an ungated clock state.

The interconnect 32 may be a communication fabric, such as a communication bus, configured to communicatively connect the components of the SoC 12. The interconnect 32 may transmit signals between the components of the SoC 12. In some embodiments, the interconnect 32 may be configured to control signals between the components of the SoC 12 by controlling timing and/or transmission paths of the signals.

Some or all of the components of the computing device 10 and/or the SoC 12 may be arranged differently and/or combined while still serving the functions of the various embodiments. The computing device 10 may not be limited to one of each of the components, and multiple instances of each component may be included in various configurations of the computing device 10.

Figure 2:
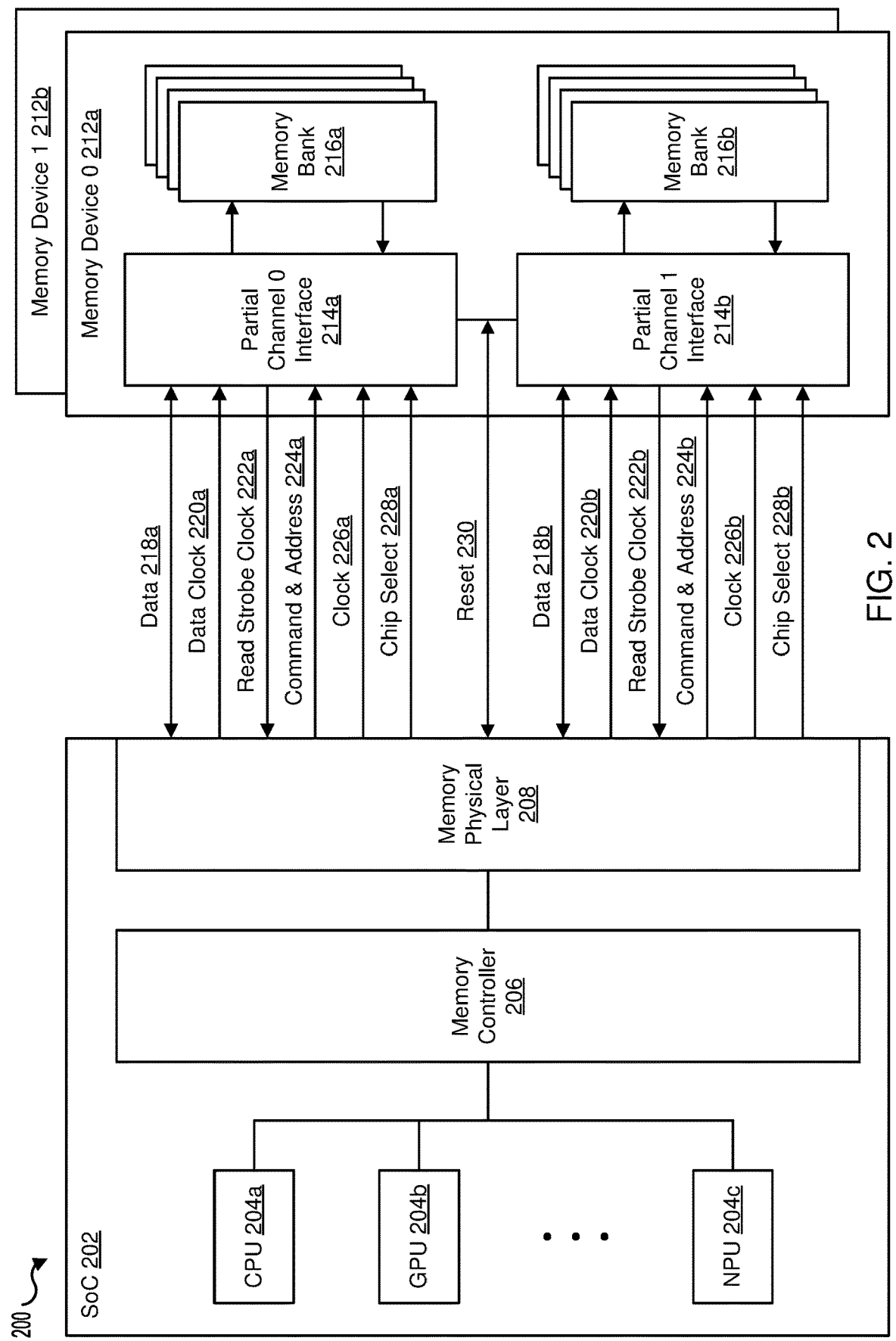
FIG. 2 is a component block diagram illustrating an example memory system having partial channels for implementing various embodiments.

FIG. 2 illustrates an example memory system 200 having partial channels for implementing various embodiments. With reference to FIGS. 1 and 2, the example memory system 200 may include an SoC 202 (e.g., SoC 12 in FIG. 1) communicatively connected to multiple memory devices 212a, 212b (e.g., memory 36 in FIG. 1). The SoC 202 may include any number and combination of processors 204a, 204b, 204c (e.g., processor 14 in FIG. 1) communicatively connected to a memory controller 206 (e.g., memory interface 34 in FIG. 1) and to a memory physical layer 208 (e.g., memory interface 34 in FIG. 1). Each memory device 212a, 212b may include multiple partial channel interfaces 214a, 214b communicatively connected to at least one memory bank 216a, 216b.

The processors 204a-204c (e.g., CPU 204a, GPU 204b, NPU 204c) may be configured to execute program instructions including reading and/or writing to the memory devices 212a, 212b. Memory access commands may be generated and sent by the processors 204a-204c for implementing the read and/or write instructions at the memory devices 212a, 212b.

The memory controller 206 may receive the memory access commands from any number and combination of the processors 204a-204c. The memory access commands may include information for implementing the read and/or write instructions at the memory devices 212a, 212b. Such information may include virtual and/or physical addresses of the memory devices 212a, 212b at which to implement the read and/or write instructions. The memory controller 206 may identify addresses of locations at the memory devices 212a, 212b corresponding to the addresses of the memory access commands and direct the memory access commands to the locations. In some embodiments, the addresses of the locations at the memory devices 212a, 212b may be identified by mapping or converting the addresses of the memory access commands to addresses of the locations using an algorithm and/or a mapping table, such as a mapping table stored at a translation lookaside buffer. The memory controller 206 may send the memory access commands, addresses of the locations at the memory devices 212a, 212b, and/or signals for activating the components of the memory devices 212a, 212b for the corresponding locations. In some embodiments, the memory controller 206 may be separate from the processors 204a-204c. In some embodiments, one or more memory controllers 206 may be integral to one or more of the processors 204a-204c.

The physical layer 208 may receive the memory access commands, addresses of the locations at the memory devices 212a, 212b, and/or signals for activating the components of the memory devices 212a, 212b for the corresponding locations from the memory controller 206. The physical layer 208 may send the memory access commands, addresses of the locations at the memory devices 212a, 212b, and/or signals for activating the components of the memory devices 212a, 212b for the corresponding locations along with other signals via a communication bus. The communication bus may include various sub-buses and lines 218a, 218b, 220a, 220b, 222a, 222b, 224a, 224b, 226a, 226b, 228a, 228b, 230 to enable communication between the SoC 202 and the memory devices 212a, 212b. For example, the physical layer 208 may send signals for the memory access commands including: data signals via one or more data buses 218a, 218b; data clock signals via one or more data clock lines 220a, 220b; read strobe clock signals via one or more read strobe clock lines 222a, 222b; memory access commands and addresses of the locations signals via one or more command and address buses 224a, 224b, clock signals via one or more clock lines 226a, 226b; chip select signals via one or more chip select buses 228a, 228b; and/or reset signals via a reset line 230.

Depending on the addresses of the locations at the memory devices 212a, 212b, the physical layer 208 may send the signals via specific combinations of the sub-buses and lines 218a, 218b, 220a, 220b, 222a, 222b, 224a, 224b, 226a, 226b, 228a, 228b, 230. For example, for memory access commands directed to addresses of the locations associated with partial channel 0 (such as locations at memory bank 216a) of one or more of the memory devices 212a, 212b, the physical layer 208 may send the signals via the sub-buses and lines 218a, 220a, 222a, 224a, 226a, 228a. Similarly, for memory access commands directed to addresses of the locations associated with partial channel 1 (such as locations at memory bank 216b) of one or more of the memory devices 212a, 212b, the physical layer 208 may send the signals via the sub-buses and lines 218b, 220b, 222b, 224b, 226b, 228b.

The memory devices 212a, 212b may receive the signals sent by the physical layer 208 via the communication bus. The signals may be received at the partial channel interfaces 214a, 214b of the memory devices 212a, 212b. For example, for memory access commands directed to addresses of the locations associated with partial channel 0 (such as locations at memory bank 216a) of one or more of the memory devices 212a, 212b, the signals may be received at partial channel 0 interface 214a of the memory devices 212a, 212b. Similarly, for memory access commands directed to addresses of the locations associated with partial channel 1 (such as locations at memory bank 216b) of one or more of the memory devices 212a, 212b, the signals may be received at partial channel 1 interface 214b of the memory devices 212a, 212b.

The partial channel interfaces 214a, 214b may interpret and/or send the signals to one or more memory banks 216a, 216b to which of the partial channel interfaces 214a, 214b are communicatively connected. For example, the chip select signals may be interpreted by and indicate to the partial channel interfaces 214a, 214b on which of the memory devices 212a, 212b to activate the communicatively connected memory banks 216a, 216b and/or implement the memory access commands at the communicatively connected memory banks 216a, 216b. For example, for chip select signals received via the chip select bus 228a, different values may indicate to the partial channel 0 interface 214a to activate the memory banks 216a and/or implement the memory access commands at the memory banks 216a of one of the memory devices 212a, 212b. As another example, for chip select signals received via the chip select bus 228b, different values may indicate to the partial channel 1 interface 214b to activate the memory banks 216b and/or implement the memory access commands at the memory banks 216b of one of the memory devices 212a, 212b.

In some embodiments, the addresses of the locations at the memory devices 212a, 212b may be within a rank of one or more memory devices 212a, 212b. As referred to herein, a rank may include a memory space across multiple memory banks 216a, 216b of one memory device 212a, 212b for which at least two memory banks 216a, 216b are associated with different partial channels. For example, for a DDR dual in-line memory module (DIMM), memory devices 212a, 212b located on opposite sides of the DIMM may be part of different ranks. In some embodiments, the addresses of the locations at the memory devices 212a, 212b may be within a logical rank of multiple memory devices 212a, 212b. As referred to herein, a logical rank may include a memory space across multiple memory banks 216a, 216b of multiple memory devices 212a, 212b for which the memory banks 216a, 216b of two memory devices 212a, 212b are associated with different partial channels. For example, for a DDR DIMM, memory devices 212a, 212b located on opposite sides of the DIMM may be part of a logical rank. In some embodiments, two memory devices 212a, 212b of a logical rank may be communicatively connected to the same sub-buses and lines 218a, 218b, 220a, 220b, 222a, 222b, 224a, 224b, 226a, 226b, 228a, 228b, 230.

Figure 3:
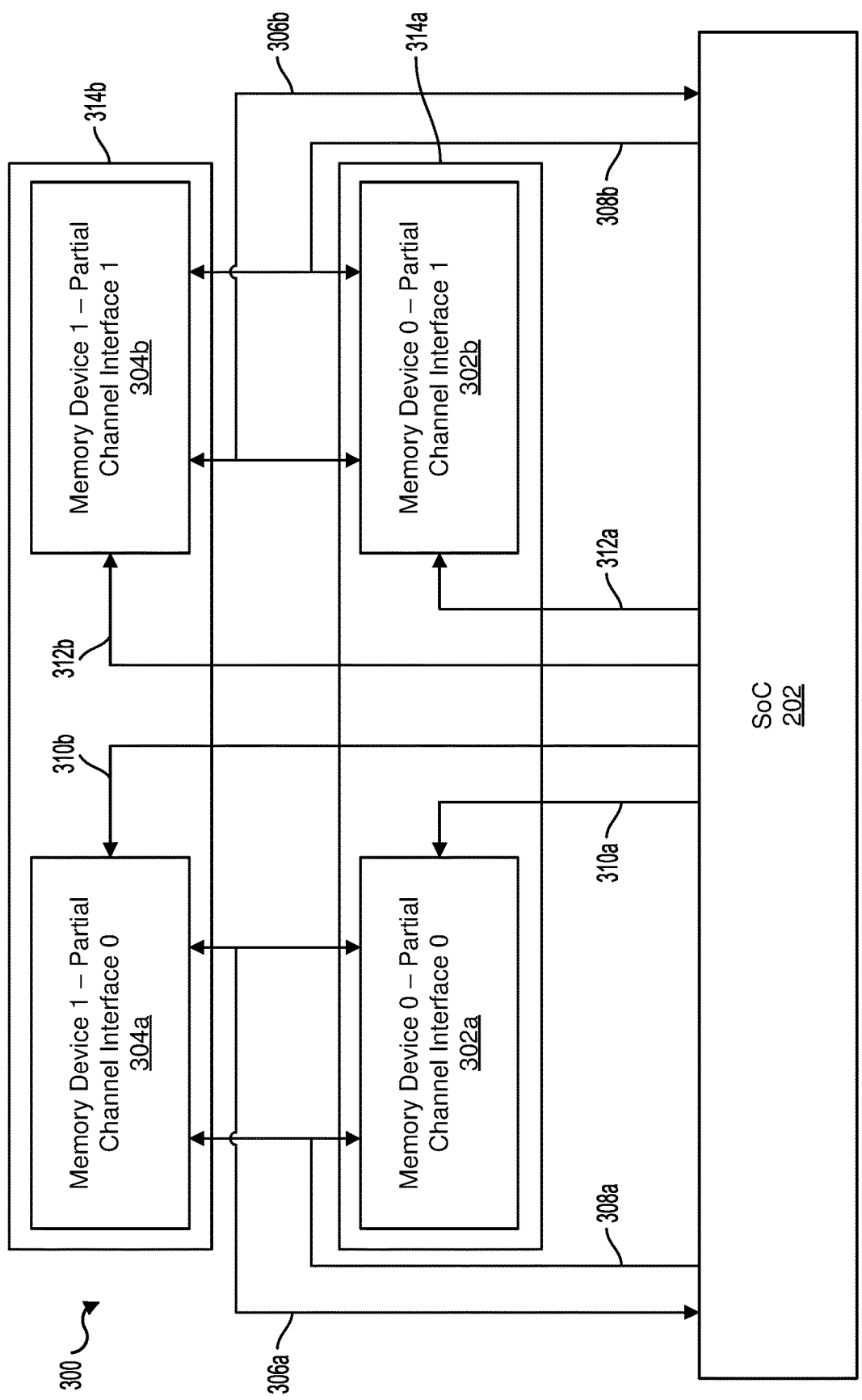
FIG. 3 is a component block diagram illustrating an example memory system having a rank structure based on partial channels of a memory device for implementing various embodiments.
Figure 4:
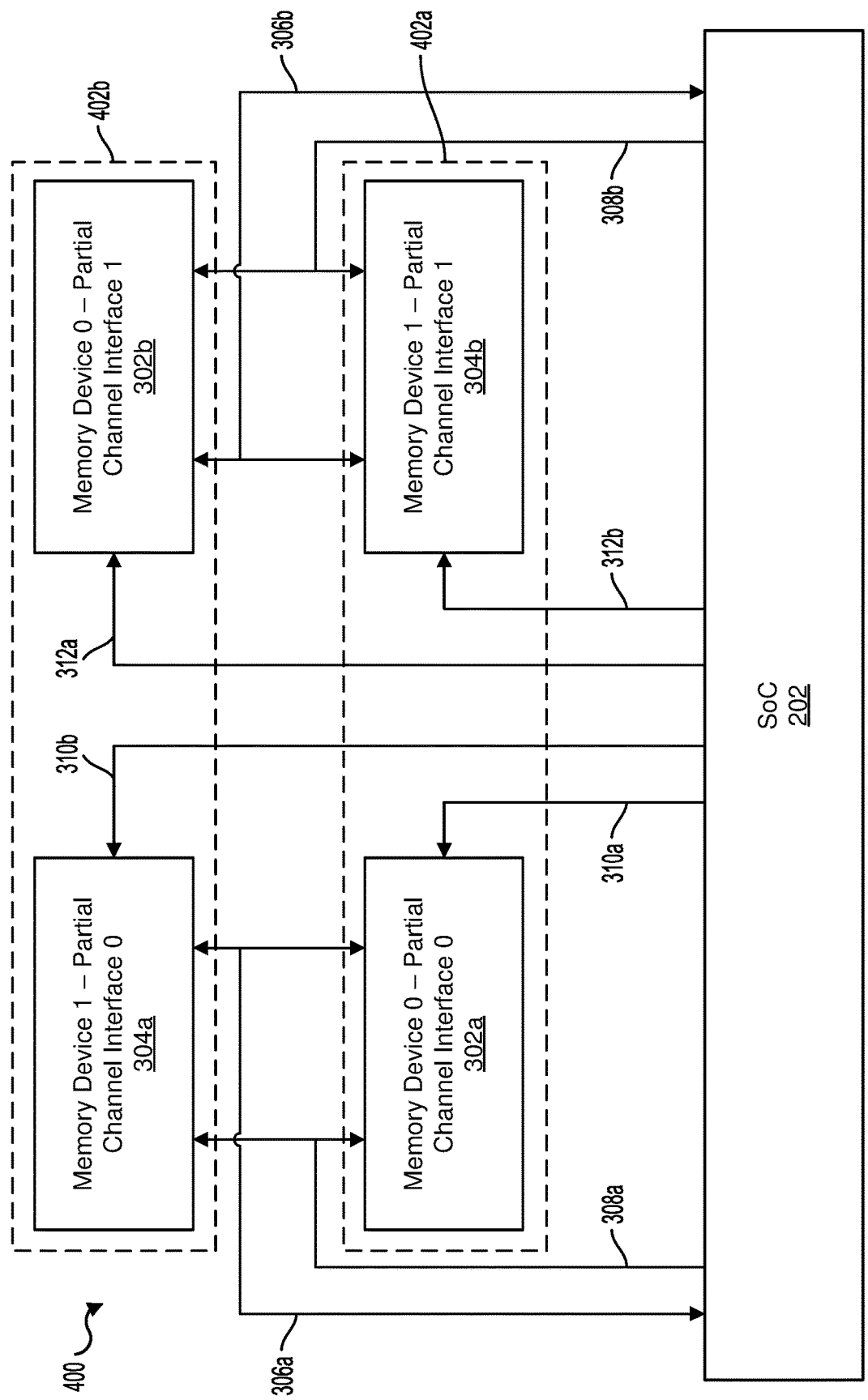
FIG. 4 is a component block diagram illustrating an example memory system having a logical rank structure based on partial channels of multiple memory devices for implementing various embodiments.

FIG. 3 illustrates an example memory system 300 (e.g., memory system 200 in FIG. 2) having a rank structure based on partial channels of a memory device (e.g., memory 36 in FIG. 1, memory device 212a, 212b in FIG. 2) for implementing various embodiments. FIG. 4 illustrates an example memory system 400 (e.g., memory system 200 in FIG. 2) having a logical rank structure based on partial channels of a memory device (e.g., memory 36 in FIG. 1, memory device 212a, 212b in FIG. 2) for implementing various embodiments. With reference to FIGS. 1-4, the memory systems 300, 400 may include the SoC 202 (e.g., SoC 12 in FIG. 1) communicatively connected to multiple partial channel interfaces 302a, 302b, 304a, 304b (e.g., partial channel interfaces 214a, 214b in FIG. 2) of multiple memory devices (not shown) via various buses and lines 306a, 306b, 308a, 308b, 310a, 310b, 312a, 312b (e.g., sub-buses and lines 218a, 218b, 220a, 220b, 222a, 222b, 224a, 224b, 226a, 226b, 228a, 228b, 230 in FIG. 2).

In the examples illustrated in FIGS. 3 and 4, the partial channel interfaces 302a ("partial channel interface 0" in FIGS. 3 and 4), 302b ("partial channel interface 1" in FIGS. 3 and 4) may be partial channel interfaces of the same memory device ("memory device 0" in FIGS. 3 and 4). The partial channel interfaces 304b ("partial channel interface 0" in FIGS. 3 and 4), 304b ("partial channel interface 1" in FIGS. 3 and 4) may be partial channel interfaces of the same memory device ("memory device 1" in FIGS. 3 and 4) that is different from the memory device of the partial channel interfaces 302a, 302b.

The SoC 202 may be communicatively connected to the partial channel interfaces 302a, 304a of different memory devices via a data bus 306a (e.g., data bus 218a, 218b in FIG. 2), a command and address bus 308a (e.g., command and address bus 224a, 224b in FIG. 2), and one or more chip select lines 310a, 310b (e.g., individual lines of chip select bus 228a, 228b in FIG. 2). Similarly, the SoC 202 may be communicatively connected to the partial channel interfaces 302b, 304b of different memory devices via a data bus 306b (e.g., data bus 218a, 218b in FIG. 2), a command and address bus 308b (e.g., command and address bus 224a, 224b in FIG. 2), and one or more chip select lines 312a, 312b (e.g., individual lines of chip select bus 228a, 228b in FIG. 2). In some embodiments, the SoC 202 may be communicatively connected to each partial channel interface 302a, 302b, 304a, 304b via an individual chip select line 310a, 310b, 312a, 312b. The SoC 202 may be communicatively connected to the partial channel interfaces 302a, 302b, 304a, 304b via other buses and lines, as described with reference to FIG. 2, omitted in the example in FIG. 3 for clarity.

Using components of the SoC 202 (not shown; e.g., memory controller 206, memory physical layer 208 in FIG. 2) and/or the various buses and lines 306a, 306b, 308a, 308b, 310a, 310b, 312a, 312b, the SoC 202 may send signals for implementing memory access commands to the partial channel interfaces 302a, 302b, 304a, 304b. For example, the SoC 202 may send data signals via one or more data buses 306a, 306b and/or memory access commands and addresses signals via one or more command and address buses 308a, 308b. The SoC 202 may send chip select signals via one or more chip select line 310a, 310b, 312a, 312b to indicate to the partial channel interfaces 302a, 302b, 304a, 304b which memory device components (not shown; e.g., memory banks 216a, 216b in FIG. 2) to activate and/or to use to implement the memory access commands.

The memory device components controlled by the partial channel interfaces 302a, 302b, 304a, 304b may be organized in ranks 314a, 314b in the example illustrated in FIG. 3. For example, the rank 314a may include the memory device components of the memory device 0 controlled by the partial channel interface 0 302a and the partial channel interface 1 302b. The rank 314b may include the memory device components of the memory device 1 controlled by the partial channel interface 0 304a and the partial channel interface 1 304b. The SoC 202 may be configured to send chip select signals for the memory device components of a rank 314a, 314b for memory access commands targeting addresses of locations at the memory devices within the rank 314a, 314b. For example, for a memory access command targeting an address of a location with the rank 314a, the SoC 202 may send chip select signals to the partial channel interface 0 302a of the memory device 0 via the chip select line 310a and the partial channel interface 1 302b of the memory device 0 via the chip select line 312a. For a memory access command targeting an address of a location with the rank 314b, the SoC 202 may send chip select signals to the partial channel interface 0 304a of the memory device 1 via the chip select line 310b and the partial channel interface 1 304b of the memory device 1 via the chip select line 312b.

The partial channel interfaces 302a, 302b, 304a, 304b controlling the memory device components of the ranks 314*a*, 314*b* may receive the chip select signals via the chip select lines 310*a*, 310*b*, 312*a*, 312*b*. The chip select signals may be interpreted by the partial channel interfaces 302*a*, 302*b*, 304*a*, 304*b* to activate and/or to use the memory device components of the ranks 314*a*, 314*b* corresponding to the chip select signals to implement the memory access commands.

The memory device components controlled by the partial channel interfaces 302*a*, 302*b*, 304*a*, 304*b* may be organized in logical ranks 402*a*, 402*b* in the example illustrated in FIG. 4. For example, the logical rank 402*a* may include the memory device components of the memory device 0 controlled by the partial channel interface 0 302*a* and the memory device components of the memory device 1 controlled by the partial channel interface 1 304*b*. The logical rank 402*b* may include the memory device components of the memory device 1 controlled by the partial channel interface 0 304*a* and the memory device components of the memory device 0 controlled by the partial channel interface 1 302*b*.

The SoC 202 may be configured to send chip select signals for the memory device components of a logical rank 402*a*, 402*b* for memory access commands targeting addresses of locations at the memory devices within the logical rank 402*a*, 402*b*. For example, for a memory access command targeting an address of a location with the logical rank 402*a*, the SoC 202 may send chip select signals to the partial channel interface 0 302*a* of the memory device 0 via the chip select line 310*a* and the partial channel interface 1 302*b* of the memory device 1 via the chip select line 312*b*. For a memory access command targeting an address of a location with the logical rank 402*b*, the SoC 202 may send chip select signals to the partial channel interface 0 304*a* of the memory device 1 via the chip select line 310*b* and the partial channel interface 1 304*b* of the memory device 0 via the chip select line 312*a*.

The partial channel interfaces 302*a*, 302*b*, 304*a*, 304*b* controlling the memory device components of the logical ranks 402*a*, 402*b* may receive the chip select signals via the chip select lines 310*a*, 310*b*, 312*a*, 312*b*. The chip select signals may be interpreted by the partial channel interfaces 302*a*, 302*b*, 304*a*, 304*b* to activate and/or to use the memory device components of the logical ranks 402*a*, 402*b* corresponding to the chip select signals to implement the memory access commands.

In some embodiments, ranks 314*a*, 314*b* and logical ranks 402*a*, 402*b* may be implemented in the same memory system 300, 400. In some embodiments, sending chip selects signal may include asserting signals via the chip select lines 310*a*, 310*b*, 312*a*, 312*b*. In some embodiments, sending chip selects signal may include de-asserting signals via the chip select lines 310*a*, 310*b*, 312*a*, 312*b*.

FIGS. 5A and 5B illustrate examples of memory access commands using rank structure and logical rank structure memory systems (e.g., memory system 200, 300, 400 in FIGS. 2-4) according to an embodiment. With reference to FIGS. 1-5B, FIG. 5A illustrates an example of a rank structure memory system implementing memory access commands over time using different partial channels of the same memory device (e.g., memory 36 in FIG. 1, memory device 212*a*, 212*b* in FIG. 2). FIG. 5B illustrates an example of a logical rank structure memory system implementing memory access commands over time using different partial channels of different memory devices (e.g., memory 36 in FIG. 1, memory device 212*a*, 212*b* in FIG. 2).

In the example illustrated in FIG. 5A, the different partial channels ("partial channel 0" and "partial channel 1" in FIG. 5A) of the memory device ("memory device 0" in FIG. 5A) may be used to implement memory access commands ("write/read operations" in FIG. 5A) received from an SoC (e.g., SoC 202 in FIGS. 2 and 3) within a rank (e.g., rank 314*a*, 314*b* in FIG. 3). Each partial channel may implement the memory access commands as controlled by a partial channel interface (e.g., partial channel interface 214*a*, 214*b*, 302*a*, 302*b*, 304*a*, 304*b* in FIGS. 2 and 3) of the partial channel for the rank. However, multiple partial channels of the same memory device have certain command timing constraints based on memory design and power distribution network limitations. For example, within the rank, executing a refresh operation ("ref" in FIG. 5A) of memory device components (e.g., memory banks 216*a*, 216*b* in FIG. 2) of a partial channel of a memory device imposes a timing constraint ("tRFC" in FIG. 5A) during which the memory device cannot implement another refresh operation of the memory device components of another partial channel of the same memory device. For example, while a refresh operation is implemented for the memory device components of partial channel 0, no refresh operation can be implemented for the memory device components of partial channel 1 until the period tRFC elapses. Multiple refresh operations for the memory device components of different partial channels of the same memory device, or within the rank, are forced to be implemented sequentially following the timing constraint.

In the example illustrated in FIG. 5B, the different partial channels ("partial channel 0" and "partial channel 1" in FIG. 5B) of the different memory devices ("memory device 0" and memory device 1" in FIG. 5B) may be used to implement memory access commands ("write/read operations" in FIG. 5B) received from an SoC (e.g., SoC 202 in FIGS. 2 and 3) within a logical rank (e.g., logical rank 402*a*, 402*b* in FIG. 4). Each partial channel may implement the memory access commands as controlled by a partial channel interface (e.g., partial channel interface 214*a*, 214*b*, 302*a*, 302*b*, 304*a*, 304*b* in FIGS. 2 and 3) of the partial channel within the logical rank.

Using the different partial channels of the different memory devices may avoid the command timing constraints based on memory design and power distribution network limitations of the example illustrated in FIG. 5A using the different partial channels of the same memory device. For example, within the logical rank, executing a refresh operation ("ref" in FIG. 5B) of memory device components (e.g., memory banks 216*a*, 216*b* in FIG. 2) of a partial channel of a memory device, another refresh operation of the memory device components of another partial channel of another memory device may be implemented in parallel. For example, while a refresh operation is implemented for the memory device components of partial channel 0 of the memory device 0, a refresh operation may be implemented for the memory device components of partial channel 1 of the memory device 1.

Multiple refresh operations for the memory device components of different partial channels of the different memory devices, or within the logical rank, may be implemented in parallel without the timing constraint illustrated in FIG. 5A. As such, implementing logical ranks, as in the example illustrated in FIG. 5B, may provide performance increases, for example, in memory access speed, over implementing ranks.

Figure 6:
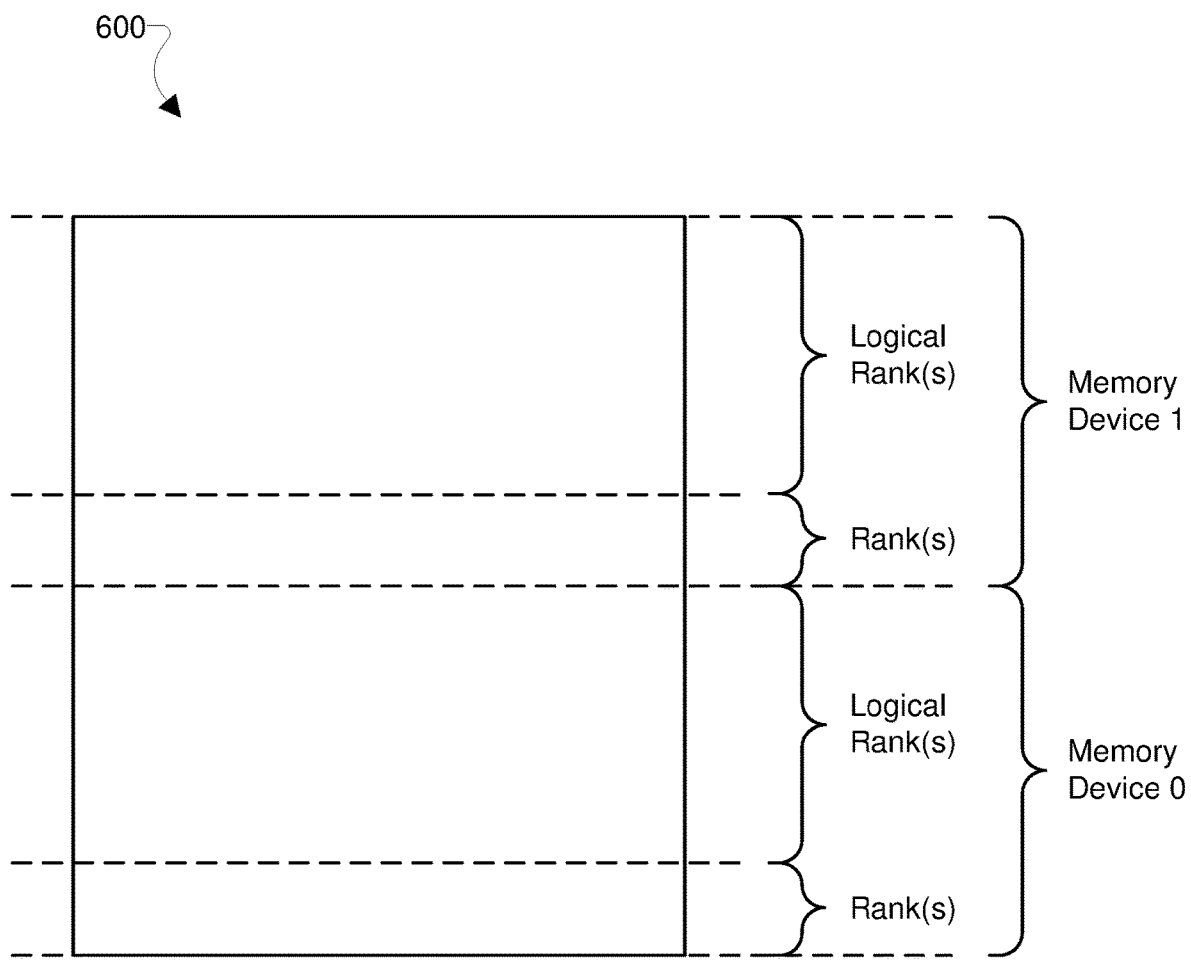
FIG. 6 is a block diagram illustrating an example memory space having partitions ranks and logical ranks for implementing various embodiments.

FIG. 6 illustrate an example memory space 600 having partitions for ranks (e.g., ranks 314*a*, 314*b* in FIG. 3) and logical ranks (e.g., logical ranks 402*a*, 402*b* in FIG. 4) for implementing various embodiments. With reference to FIGS. 1-6, the memory space 600 may include memory spaces of one or more memory devices (e.g., memory 36 in FIG. 1, memory device 212a, 212b in FIG. 2) and include memory spaces for one or more ranks and/or logical ranks. The allocation of the memory space 600 for ranks and logical ranks may be in any proportion. The proportion may be set based on system need of a computing device (e.g., computing device 10 in FIG. 1), such as needs for speed performance and power efficiency. For example, given the performance benefits of logical ranks over ranks, the allocation of the memory space 600 for logical ranks may be greater than the allocation of the memory space 600 for ranks.

In some embodiments, the memory space 600 may be allocated only to logical ranks. The ability to use both ranks and logical ranks may enable benefits in power efficiency over using logical ranks alone, as when using ranks, a memory device not part of a rank targeted by a memory access command may be put in a low power state.

The allocation of memory space 600 for logical ranks may be spread across multiple memory devices. For example, the allocation of the memory space 600 for a logical rank may include memory space of memory device 0 and memory device 1 in the example illustrated in FIG. 6. The allocation of the memory space 600 for ranks may be constrained to individual memory devices. For example, the allocation of the memory space 600 for a rank may include memory space of memory device 0 and allocation of the memory space 600 for another rank may include memory space of memory device 1 in the example illustrated in FIG. 6.

Figure 7:
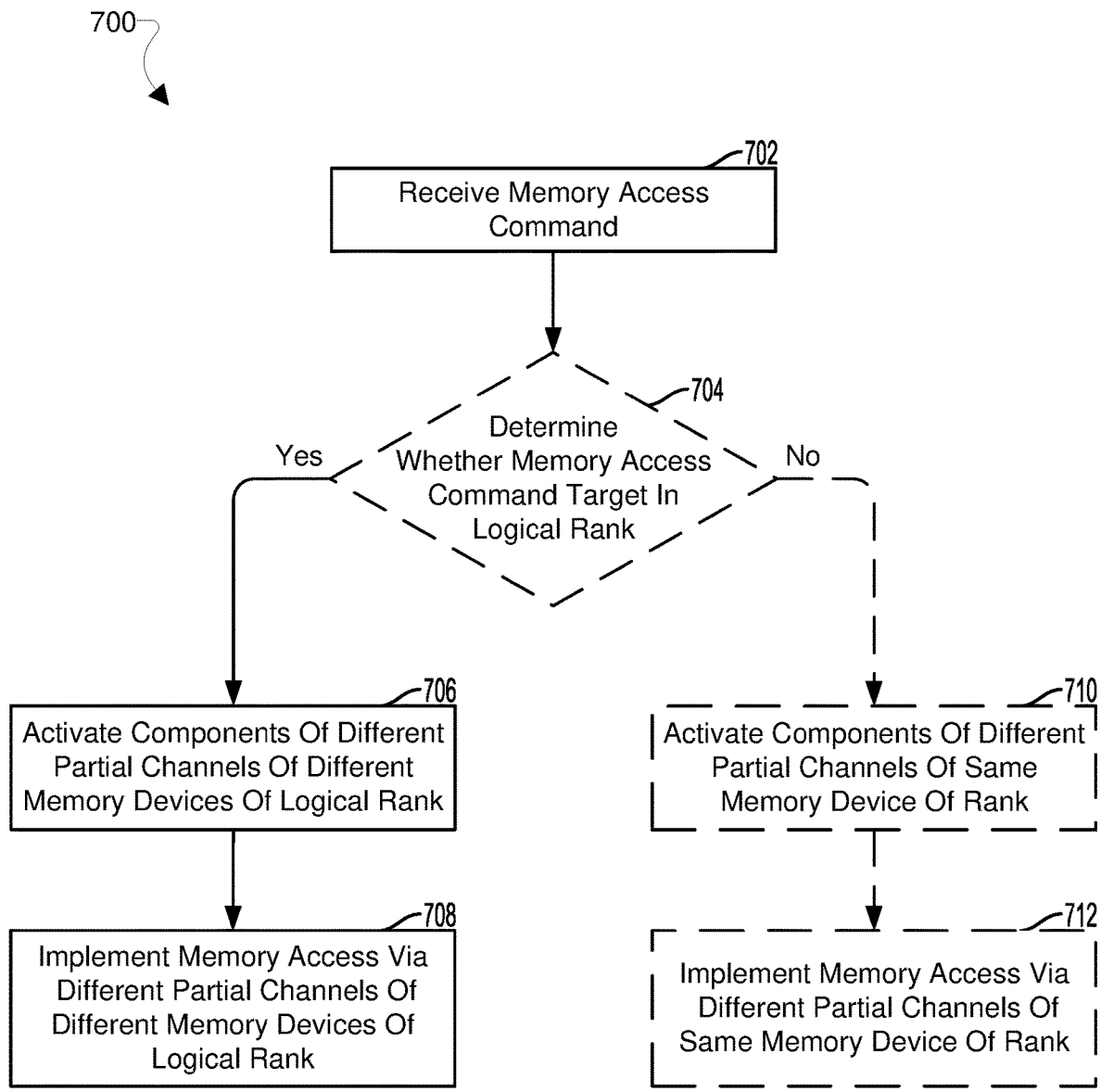
FIG. 7 is a process flow diagram illustrating a method for implementing flexible ranks in a memory system according to some embodiments.

FIG. 7 illustrates a method for implementing flexible ranks in a memory system according to some embodiments. With reference to FIGS. 1-7, the method 700 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 700 is referred to herein as a "flexible rank controller."

In block 702, the flexible rank controller may receive a memory access command. The memory access command may originate from a client software executing on a processor (e.g., processor 14, 204a-204c in FIGS. 1 and 2) that may require access to a memory (e.g., memory 36 in FIG. 1, memory device 212a, 212b in FIG. 2) to implementing instructions. The received memory access command may include an address at the memory for implementation of the memory access command. Receiving the memory access command is further described in the method 800 with reference to FIG. 8. In some embodiments, the flexible rank controller receiving the memory access command in block 702 may be a memory controller (e.g., memory controller 206 in FIG. 2) and/or an SoC (e.g., SoC 12, 202 in FIGS. 1-4).

In optional determination block 704, the flexible rank controller may determine whether the address at which to implement the memory access command is within a logical rank (e.g., logical rank 402a, 402b in FIG. 4) of the memory. In some embodiments, the flexible rank controller may use at least part of the address to determine whether the address is within a logical rank based on a mapping of the part of the logical address to a logical rank. For example, the at least part of the address may be mapped directly to a logical rank. As another example, the at least part of the address may be within a range of values mapped to a logical rank. As another example, the at least part of the address may be mapped to a partial channel of the memory and the partial channel may be mapped to a logical rank. In some examples the flexible rank controller determining whether the address at which to implement the memory access command is within a logical rank of the memory in optional block 704 may be the memory controller and/or the SoC.

Figure 9:
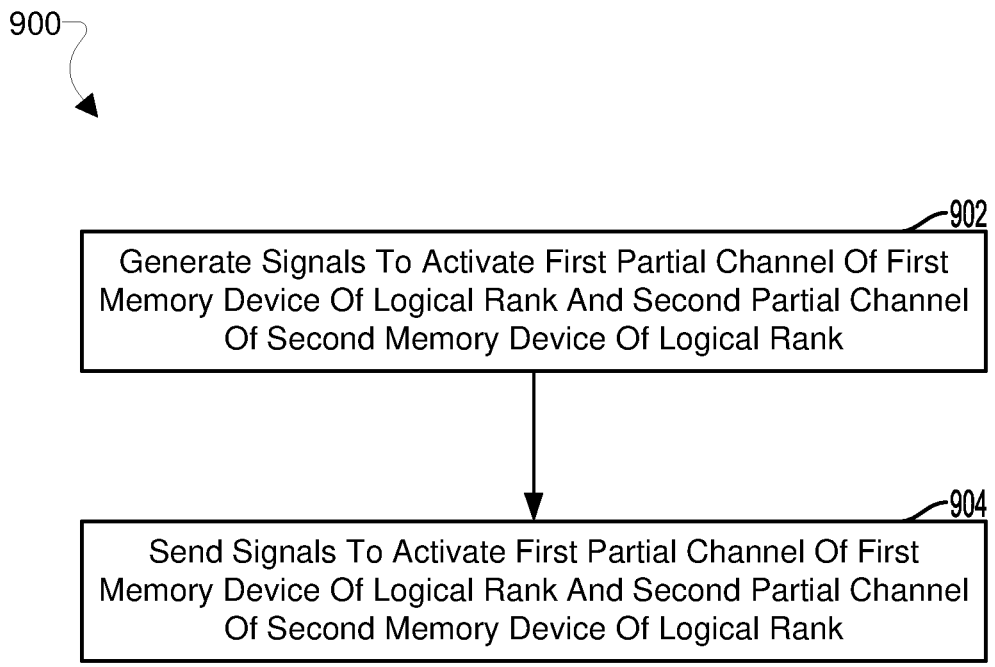
FIG. 9 is a process flow diagram illustrating a method for activating logical ranks in a memory system according to some embodiments.

Following receiving the memory access command in block 702, or in response to determining that the address at which to implement the memory access command is within a logical rank of the memory (i.e., optional block 704="Yes"), the flexible rank controller may activate components (e.g., memory banks 216a, 216b in FIG. 2) of different partial channels of different memories of the logical rank in block 706, as further described in the method 900 with reference to FIG. 9. In some embodiments, the flexible rank controller activating the components of the different partial channels of the different memories of the logical rank in block 706 may be the memory controller, the SoC, and/or a memory physical layer (e.g., memory physical layer 208 in FIG. 2).

Figure 10:
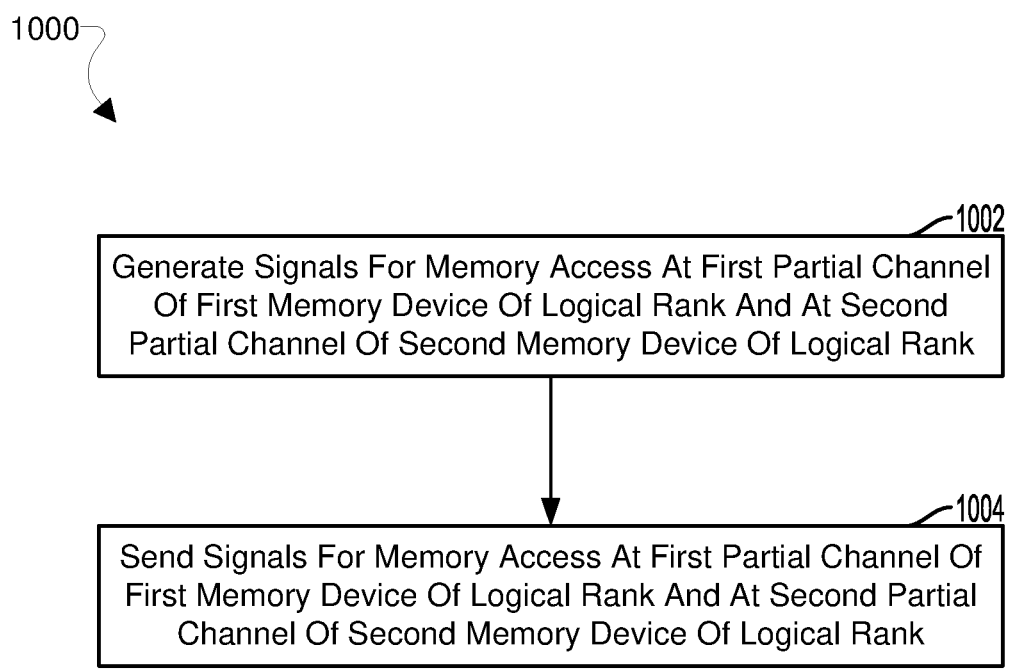
FIG. 10 is a process flow diagram illustrating a method for implementing memory access using logical ranks in a memory system according to some embodiments.

In block 708, the flexible rank controller may implement a memory access via the different partial channels of the different memories of the logical rank, as further described in the method 1000 with reference to FIG. 10. In some embodiments, the flexible rank controller implementing the memory access via the different partial channels of the different memories of the logical rank in block 708 may be the memory controller, the SoC, and/or a memory physical layer (e.g., memory physical layer 208 in FIG. 2).

In response to determining that the address at which to implement the memory access command is not within a logical rank of the memory (i.e., optional block 704="No"), the flexible rank controller may activate components (e.g., memory banks 216a, 216b in FIG. 2) of different partial channels of a same memory of a rank (e.g., rank 314a, 314b in FIG. 3) in optional block 710, as further described in the method 1100 with reference to FIG. 11. In some embodiments, the flexible rank controller activating the components of the different partial channels of the same memory of the rank in block 710 may be the memory controller, the SoC, and/or the memory physical layer.

In optional block 712, the flexible rank controller may implement a memory access via the different partial channels of the same memory of the rank, as further described in the method 1200 with reference to FIG. 12. In some embodiments, the flexible rank controller implementing the memory access via the different partial channels of the same memories of the rank in block 712 may be the memory controller, the SoC, and/or a memory physical layer (e.g., memory physical layer 208 in FIG. 2).

Figure 8:
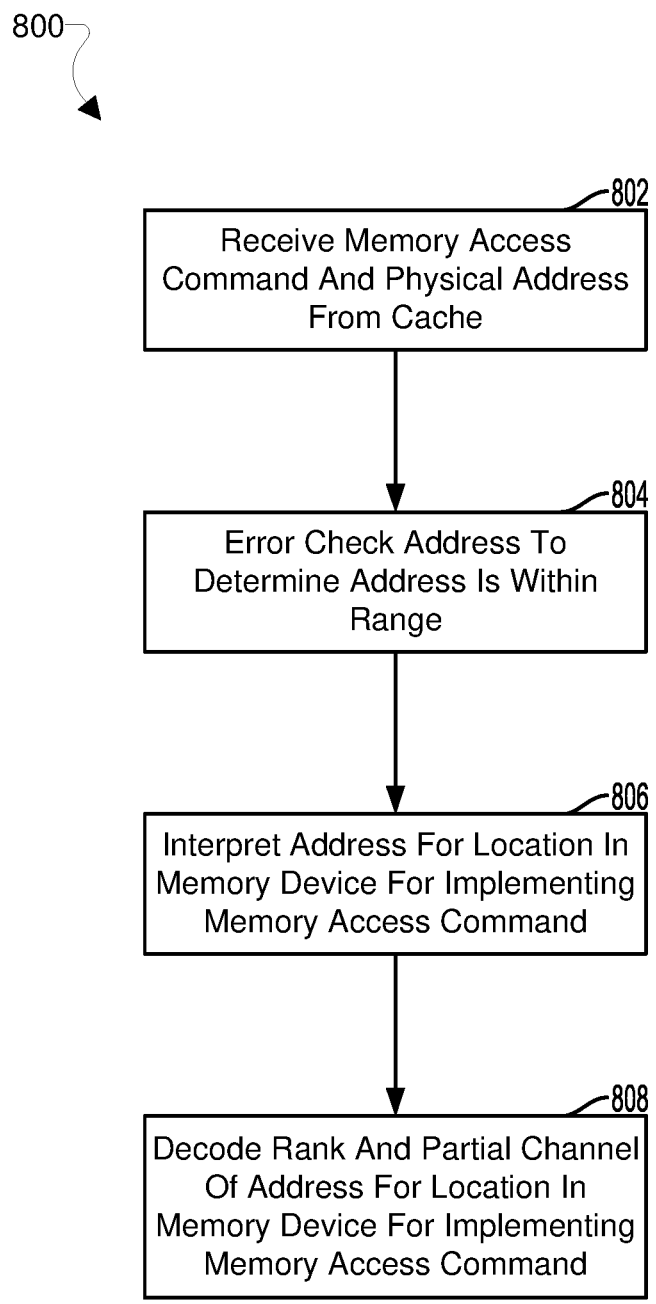
FIG. 8 is a process flow diagram illustrating a method for implementing flexible ranks in a memory system according to some embodiments.

FIG. 8 illustrates a method for implementing flexible ranks in a memory system according to some embodiments. With reference to FIGS. 1-8, the method 800 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 800 is referred to herein as a "flexible rank controller." The method 800 includes operations that may be performed as part of receiving the memory access command in block 702 of the method 700 described herein with reference to FIG. 7.

In block 802, the flexible rank controller may receive a memory access command and a physical address of a memory (e.g., memory 36 in FIG. 1, memory device 212a, 212b in FIG. 2) at which to implement the memory access command. The memory access command may originate from a client software executing on a processor (e.g., processor 14, 204a-204c in FIGS. 1 and 2) that may require access to the memory to implementing instructions. The client software may issue the memory access command for a virtual address of virtual memory, which may be converted to a physical address of the memory, for example by a virtual memory management unit implemented on a processor, and provided to the flexible rank controller. The memory access command and physical address may be provided to the flexible rank controller via a cache (e.g., memory 16 in FIG. 1). In some embodiments, the flexible rank controller receiving the memory access command and the physical address of the memory at which to implement the memory access command in block 802 may be a memory controller (e.g., memory controller 206 in FIG. 2) and/or an SoC (e.g., SoC 12, 202 in FIGS. 1-4).

In block 804, the flexible rank controller may error check the physical address to determine whether the physical address is within range of the memory. The flexible rank controller may us known mechanisms of error checking to determine whether the physical address is within range of the memory. In some embodiments, the flexible rank controller error checking the physical address to determine whether the physical address is within range of the memory in block 804 may be the memory controller and/or the SoC.

In block 806, the flexible rank controller may interpret the physical address of a location in the memory for implementing the memory access command. The flexible rank controller may parse portions of the physical address to extract information indicating a row, a column, a bank, a partial channel, and/or a rank (e.g., rank 314a, 314b in FIG. 3) of the memory based on bit locations of the physical address data. For example, one or more least significant bits of the physical address may indicate a column address. As another example, one or more most significant bits of the physical address may indicate a rank and/or logical rank for the memory. Similarly, another designated bit of the physical address may indicate a partial channel for the memory. A value, such as a binary value at any one or more designated bit locations, may indicate to the flexible rank controller the aspects of the row, the column, the bank, the partial channel, and/or the rank. In some embodiments, the flexible rank controller interpreting the physical address of the location in the memory for implementing the memory access command in block 806 may be the memory controller and/or the SoC.

In block 808, the flexible rank controller may decode the rank and the partial channel of the physical address of the location in the memory for implementing the memory access command. The flexible rank controller may read the rank and the partial channel from the physical address of the memory at which to implement the memory access command. When use of logical ranks is enabled, the flexible rank controller may map the rank and the partial channel to a logical rank and the partial channel at which to implement the memory access command. For example, bit values of the physical address indicating: a first rank and a first partial channel may be mapped to the first rank and the first partial; a second rank and a second partial channel may be mapped to the first rank and the second partial channel; the first rank and the second partial channel may be mapped to the second rank and the second partial; and the second rank and the first partial channel may be mapped to the second rank and the first partial. The flexible rank controller may map the rank and the partial channel to a logical rank and the partial channel at which to implement the memory access command by manipulating the bit values of the physical address indicating the rank and the partial channel. In some embodiments, the flexible rank controller decoding the rank and the partial channel of the physical address of the location in the memory for implementing the memory access command in block 808 may be the memory controller and/or the SoC.

FIG. 9 illustrates a method for activating logical ranks in a memory system according to some embodiments. With reference to FIGS. 1-9, the method 900 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 900 is referred to herein as a "flexible rank controller." The method 900 includes operations that may be performed as part of activating components (e.g., memory banks 216a, 216b in FIG. 2) of different partial channels of different memories (e.g., memory 36 in FIG. 1, memory device 212a, 212b in FIG. 2) of a logical rank (e.g., logical rank 402a, 402b in FIG. 4) in block 706 of the method 700, described herein with reference to FIG. 7.

In block 902, the flexible rank controller may generate signals to activate a first partial channel of a first memory of the logical rank and a second partial channel of a second memory of the logical rank. The flexible rank controller may generate signals, including chip select signals, configured to indicate to the first memory and the second memory to activate the components associated with the first partial channel and the second partial channel. A first signal may indicate to a first partial channel interface (e.g., partial channel interface 214a, 214b, 302a, 302b, 304a, 304b in FIGS. 2 and 4) of the first memory to activate the components associated with the first partial channel. A second signal may indicate to a second partial channel interface (e.g., partial channel interface 214a, 214b, 302a, 302b, 304a, 304b in FIGS. 2 and 4) of the second memory to activate the components associated with the second partial channel. The flexible rank controller may generate the signals based on a decoded physical address of the location in the memory for implementing the memory access command generated in block 808 of the method 800 as described with reference to FIG. 8. In some embodiments, the flexible rank controller generating the signals to activate the first partial channel of the first memory of the logical rank and the second partial channel of the second memory of the logical rank in block 902 may be a memory controller (e.g., memory controller 206 in FIG. 2), a memory physical layer (e.g., memory physical layer 208 in FIG. 2), and/or an SoC (e.g., SoC 12, 202 in FIGS. 1-4).

In block 904, the flexible rank controller may send the signals to activate the first partial channel of the first memory of the logical rank and the second partial channel of the second memory of the logical rank. The flexible rank controller may send the signals, including chip select signals, to the first memory and the second memory via chip select lines (e.g., chip select bus 228a, 228b in FIG. 2, chip select lines 310a, 310b, 312a, 312b in FIGS. 3 and 4). The chip select line(s) may be communicatively connected to the first partial channel interface of the first memory and may carry the first signal. The chip select line(s) may be communicatively connected to the second partial channel interface of the second memory and may carry the second signal. In some embodiments, the flexible rank controller sending the signals to activate the first partial channel of the first memory of the logical rank and the second partial channel of the second memory of the logical rank in block 904 may be the memory controller, the memory physical layer, and/or the SoC.

FIG. 10 illustrates a method for implementing memory access using logical ranks in a memory system according to some embodiments. With reference to FIGS. 1-10, the method 1000 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 1000 is referred to herein as a "flexible rank controller." The method 1000 includes operations that may be performed as part of implementing a memory access via different partial channels of the different memories (e.g., memory 36 in FIG. 1, memory device 212a, 212b in FIG. 2) of a logical rank (e.g., logical rank 402a, 402b in FIG. 4) in block 708 of the method 700, described herein with reference to FIG. 7.

In block 1002, the flexible rank controller may generate signals for memory access at a first partial channel of a first memory of the logical rank and at a second partial channel of a second memory of the logical rank. The flexible rank controller may generate signals, including command and address signals, data signals, etc., configured to indicate to the first memory and the second memory to implement memory access at the components associated with the first partial channel and the second partial channel. A first signal may indicate to a first partial channel interface (e.g., partial channel interface 214a, 214b, 302a, 302b, 304a, 304b in FIGS. 2 and 4) of the first memory to implement memory access at the components associated with the first partial channel. A second signal may indicate to a second partial channel interface (e.g., partial channel interface 214a, 214b, 302a, 302b, 304a, 304b in FIGS. 2 and 4) of the second memory to implement memory access at the components associated with the second partial channel. The flexible rank controller may generate the signals based on a decoded physical address of the location in the memory for implementing the memory access command generated in block 808 of the method 800 as described with reference to FIG. 8. In some embodiments, the flexible rank controller generating the signals for memory access at the first partial channel of the first memory of the logical rank and at the second partial channel of the second memory of the logical rank in block 1002 may be a memory controller (e.g., memory controller 206 in FIG. 2), a memory physical layer (e.g., memory physical layer 208 in FIG. 2), and/or an SoC (e.g., SoC 12, 202 in FIGS. 1-4).

In block 1004, the flexible rank controller may send the signals for memory access at the first partial channel of the first memory of the logical rank and at the second partial channel of the second memory of the logical rank. The flexible rank controller may send the signals, including command and address signals, data signals, etc., to the first memory and the second memory via a communication bus (e.g., sub-buses and lines 218a, 218b, 220a, 220b, 222a, 222b, 224a, 224b, 226a, 226b, 230 in FIG. 2, buses and lines 306a, 306b, 308a, 308b in FIGS. 3 and 4). The bus may be communicatively connected to the first partial channel interface of the first memory and may carry the first signal. The bus may be communicatively connected to the second partial channel interface of the second memory and may carry the second signal. In some embodiments, the flexible rank controller sending the signals for memory access at the first partial channel of the first memory of the logical rank and at the second partial channel of the second memory of the logical rank in block 1004 may be the memory controller, the memory physical layer, and/or the SoC.

FIG. 11 illustrates a method for activating ranks in a memory system according to some embodiments. With reference to FIGS. 1-11, the method 1100 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 1100 is referred to herein as a "flexible rank controller." The method 1100 includes operations that may be performed as part of activating components (e.g., memory banks 216a, 216b in FIG. 2) of different partial channels of a same memory (e.g., memory 36 in FIG. 1, memory device 212a, 212b in FIG. 2) of a rank (e.g., rank 314a, 314b in FIG. 3) in block 710 of the method 700, described herein with reference to FIG. 7.

In block 1102, the flexible rank controller may generate signals to activate a first partial channel of a memory of the rank and a second partial channel of the same memory of the rank. The flexible rank controller may generate signals, including chip select signals, configured to indicate to the memory to activate the components associated with the first partial channel and the second partial channel. A first signal may indicate to a first partial channel interface (e.g., partial channel interface 214a, 214b, 302a, 302b, 304a, 304b in FIGS. 2 and 3) of the memory to activate the components associated with the first partial channel. A second signal may indicate to a second partial channel interface (e.g., partial channel interface 214a, 214b, 302a, 302b, 304a, 304b in FIGS. 2 and 3) of the same memory to activate the components associated with the second partial channel. The flexible rank controller may generate the signals based on a decoded physical address of the location in the memory for implementing the memory access command generated in block 808 of the method 800 as described with reference to FIG. 8. In some embodiments, the flexible rank controller generating the signals to activate the first partial channel of the memory of the rank and the second partial channel of the same memory of the rank in block 1102 may be a memory controller (e.g., memory controller 206 in FIG. 2), a memory physical layer (e.g., memory physical layer 208 in FIG. 2), and/or an SoC (e.g., SoC 12, 202 in FIGS. 1-4).

In block 1104, the flexible rank controller may send the signals to activate the first partial channel of the memory of the rank and the second partial channel of the same memory of the rank. The flexible rank controller may send the signals, including chip select signals, to the memory via chip select lines (e.g., chip select bus 228a, 228b in FIG. 2, chip select lines 310a, 310b, 312a, 312b in FIGS. 3 and 4). The chip select line(s) may be communicatively connected to the first partial channel interface of the memory and may carry the first signal. The chip select line(s) may be communicatively connected to the second partial channel interface of the same memory and may carry the second signal. In some embodiments, the flexible rank controller sending the signals to activate the first partial channel of the memory of the rank and the second partial channel of the same memory of the rank in block 1104 may be the memory controller, the memory physical layer, and/or the SoC.

FIG. 12 illustrates a method for implementing memory access using ranks in a memory system according to some embodiments. With reference to FIGS. 1-12, the method 1200 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory controller 206, memory physical layer 208 in FIG. 2, SoC 12, 202 in FIGS. 1-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 1200 is referred to herein as a "flexible rank controller." The method 1200 includes operations that may be performed as part of implementing a memory access via different partial channels of the same memory (e.g., memory 36 in FIG. 1, memory device 212a, 212b in FIG. 2) of a rank (e.g., rank 314a, 314b in FIG. 3) in block 712 of the method 700, described herein with reference to FIG. 7.

In block 1202, the flexible rank controller may generate signals for memory access at a first partial channel of the memory of the rank and at a second partial channel of the same memory of the rank. The flexible rank controller may generate signals, including command and address signals, data signals, etc., configured to indicate to the memory to implement memory access at the components associated with the first partial channel and the second partial channel. A first signal may indicate to a first partial channel interface (e.g., partial channel interface 214a, 214b, 302a, 302b, 304a, 304b in FIGS. 2 and 3) of the memory to implement memory access at the components associated with the first partial channel. A second signal may indicate to a second partial channel interface (e.g., partial channel interface 214a, 214b, 302a, 302b, 304a, 304b in FIGS. 2 and 3) of the same memory to implement memory access at the components associated with the second partial channel. The flexible rank controller may generate the signals based on a decoded physical address of the location in the memory for implementing the memory access command generated in block 808 of the method 800 as described with reference to FIG. 8. In some embodiments, the flexible rank controller generating the signals for memory access at the first partial channel of the memory of the rank and at the second partial channel of the same memory of the rank in block 1202 may be a memory controller (e.g., memory controller 206 in FIG. 2), a memory physical layer (e.g., memory physical layer 208 in FIG. 2), and/or an SoC (e.g., SoC 12, 202 in FIGS. 1-4).

In block 1204, the flexible rank controller may send the signals for memory access at the first partial channel of the memory of the rank and at the second partial channel of the same memory of the rank. The flexible rank controller may send the signals, including command and address signals, data signals, etc., to the memory via a communication bus (e.g., sub-buses and lines 218a, 218b, 220a, 220b, 222a, 222b, 224a, 224b, 226a, 226b, 230 in FIG. 2, buses and lines 306a, 306b, 308a, 308b in FIGS. 3 and 4). The bus may be communicatively connected to the first partial channel interface of the memory and may carry the first signal. The bus may be communicatively connected to the second partial channel interface of the same memory and may carry the second signal. In some embodiments, the flexible rank controller sending the signals for memory access at the first partial channel of the memory of the rank and at the second partial channel of the same memory of the rank in block 1204 may be the memory controller, the memory physical layer, and/or the SoC.

Figure 13:
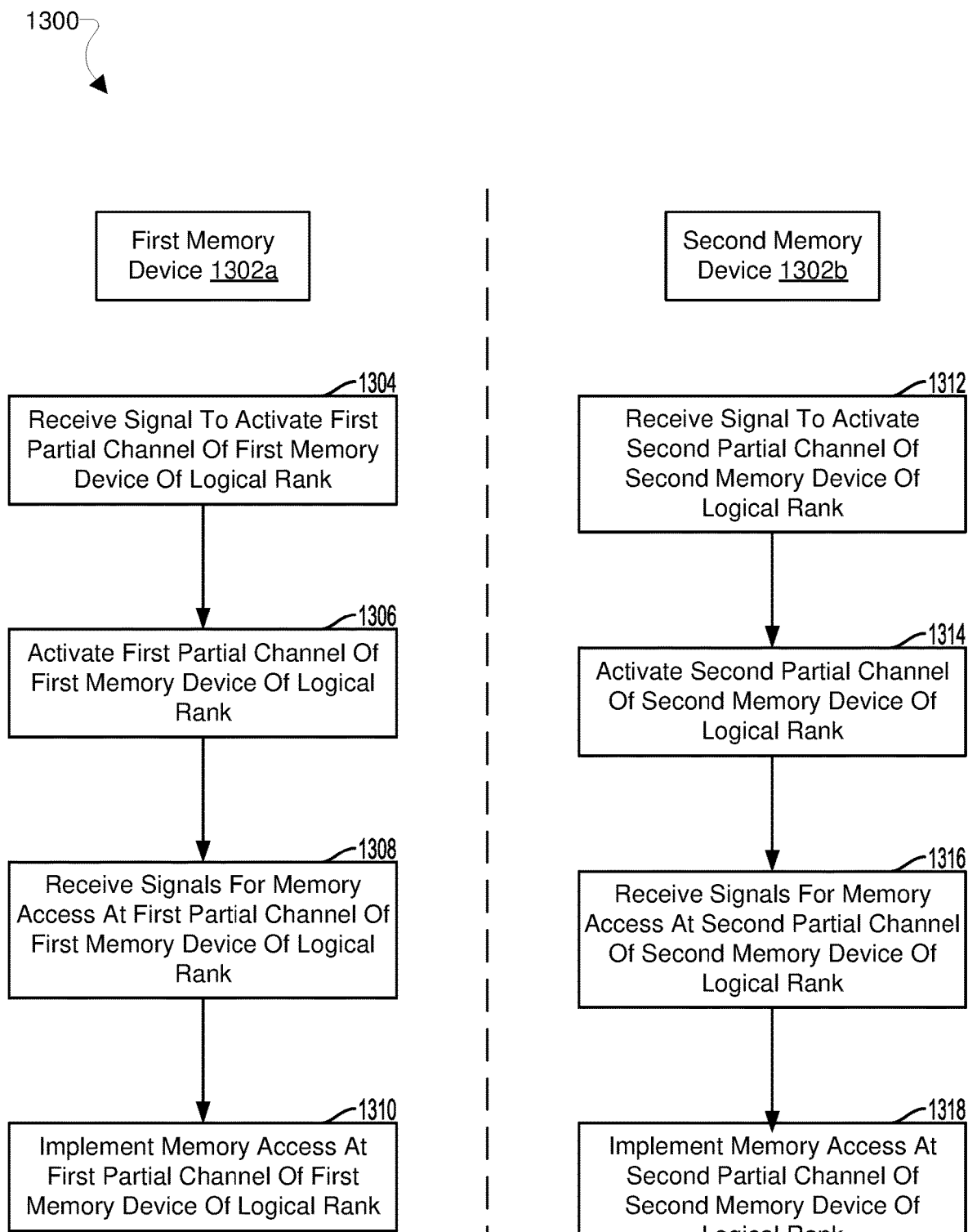
FIG. 13 is a process flow diagram illustrating a method for implementing memory access using logical ranks in a memory system according to some embodiments.

FIG. 13 illustrates a method for implementing memory access using logical ranks in a memory system according to some embodiments. With reference to FIGS. 1-13, the method 1300 may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory 36 in FIG. 1, memory device 212a, 212b in FIG. 2, partial channel interface 214a, 214b, 302a, 302b, 304a, 304b in FIGS. 2-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the method 1300 is referred to herein as a "flexible rank memory device."

In some embodiments, blocks 1304, 1306, 1308, 1310 may be implemented at a first memory device 1302a (e.g., memory device 212a, 212b in FIG. 2), and blocks 1312, 1314, 1316, 1318 may be implemented at a second memory device 1302b (e.g., memory device 212a, 212b in FIG. 2). Blocks 1304, 1306, 1308, 1310 implemented at the first memory device 1302a may be implemented in parallel with blocks 1312, 1314, 1316, 1318 implemented at the second memory device 1302b.

In block 1304, the flexible rank memory device may receive a signal to activate a first partial channel of a first memory (e.g., memory device 212a, 212b in FIG. 2) of a logical rank (e.g., logical rank 402a, 402b in FIG. 4). The flexible rank memory device may receive signals, including chip select signals, configured to indicate to the flexible rank memory device to activate components (e.g., memory banks 216a, 216b in FIG. 2) associated with the first partial channel. A first signal may indicate to a first partial channel interface (e.g., partial channel interface 214a, 214b, 302a, 302b, 304a, 304b in FIGS. 2 and 4) of the first memory to activate the components associated with the first partial channel. The flexible rank memory device may receive the signals via a chip select line(s) (e.g., chip select bus 228a, 228b in FIG. 2, chip select lines 310a, 310b, 312a, 312b in FIGS. 3 and 4). The chip select line(s) may be communicatively connected to the first partial channel interface of the first memory and may carry the first signal. In some embodiments, the flexible rank memory device receiving the signal to activate the first partial channel of the first memory of the logical rank in block 1304 may be the first memory device 1302a and/or the first partial channel interface.

In block 1306, the flexible rank memory device may activate the first partial channel of the first memory of the logical rank. Activating the first partial channel may include transitioning the components associated with the first partial channel from a low power state to an active state by known methods. In some embodiments, the flexible rank memory device activating the first partial channel of the first memory of the logical rank in block 1306 may be the first memory device 1302a and/or the first partial channel interface.

In block 1308, the flexible rank memory device may receive signals for memory access at the first partial channel of the first memory of the logical rank. The flexible rank memory device may receive signals, including command and address signals, data signals, etc., configured to indicate to the first memory to implement memory access at the components associated with the first partial channel. A first signal may indicate to the first partial channel interface of the first memory to implement memory access at the components associated with the first partial channel. The flexible rank memory device may receive the signals via a communication bus (e.g., sub-buses and lines 218a, 218b, 220a, 220b, 222a, 222b, 224a, 224b, 226a, 226b, 230 in FIG. 2, buses and lines 306a, 306b, 308a, 308b in FIGS. 3 and 4). The bus may be communicatively connected to the first partial channel interface of the first memory and may carry the first signal. In some embodiments, the flexible rank memory device receiving the signals for memory access at the first partial channel of the first memory of the logical rank in block 1308 may be the first memory device 1302a and/or the first partial channel interface.

In block 1310, the flexible rank memory device may implement memory access at the first partial channel of the first memory of the logical rank. Implementing memory access at the first partial channel may include known methods for reading from and/or writing to the components associated with the first partial channel. In some embodiments, the flexible rank memory device implementing memory access at the first partial channel of the first memory of the logical rank in block 1310 may be the first memory device 1302a and/or the first partial channel interface.

In block 1312, the flexible rank memory device may receive a signal to activate a second partial channel of a second memory (e.g., memory device 212a, 212b in FIG. 2) of the logical rank (e.g., logical rank 402a, 402b in FIG. 4). The flexible rank memory device may receive signals, including chip select signals, configured to indicate to the flexible rank memory device to activate components (e.g., memory banks 216a, 216b in FIG. 2) associated with the second partial channel. A second signal may indicate to a second partial channel interface (e.g., partial channel interface 214a, 214b, 302a, 302b, 304a, 304b in FIGS. 2 and 4) of the second memory to activate the components associated with the second partial channel. The flexible rank memory device may receive the signals via a chip select line(s) (e.g., chip select bus 228a, 228b in FIG. 2, chip select lines 310a, 310b, 312a, 312b in FIGS. 3 and 4). The chip select line(s) may be communicatively connected to the second partial channel interface of the second memory and may carry the second signal. In some embodiments, the flexible rank memory device receiving the signal to activate the second partial channel of the second memory of the logical rank in block 1312 may be the second memory device 1302b and/or the second partial channel interface.

In block 1314, the flexible rank memory device may activate the second partial channel of the second memory of the logical rank. Activating the second partial channel may include transitioning the components associated with the second partial channel from a low power state to an active state by known methods. In some embodiments, the flexible rank memory device activating the second partial channel of the second memory of the logical rank in block 1314 may be the second memory device 1302b and/or the second partial channel interface.

In block 1316, the flexible rank memory device may receive signals for memory access at the second partial channel of the second memory of the logical rank. The flexible rank memory device may receive signals, including command and address signals, data signals, etc., configured to indicate to the second memory to implement memory access at the components associated with the second partial channel. A second signal may indicate to the second partial channel interface of the second memory to implement memory access at the components associated with the second partial channel. The flexible rank memory device may receive the signals via the communication bus. The bus may be communicatively connected to the second partial channel interface of the second memory and may carry the second signal. In some embodiments, the flexible rank memory device receiving the signals for memory access at the second partial channel of the second memory of the logical rank in block 1316 may be the second memory device 1302b and/or the second partial channel interface.

In block 1318, the flexible rank memory device may implement memory access at the second partial channel of the second memory of the logical rank. Implementing memory access at the second partial channel may include known methods for reading from and/or writing to the components associated with the second partial channel. In some embodiments, the flexible rank memory device implementing memory access at the second partial channel of the second memory of the logical rank in block 1318 may be the second memory device 1302b and/or the second partial channel interface.

Figures 14A, 14B:
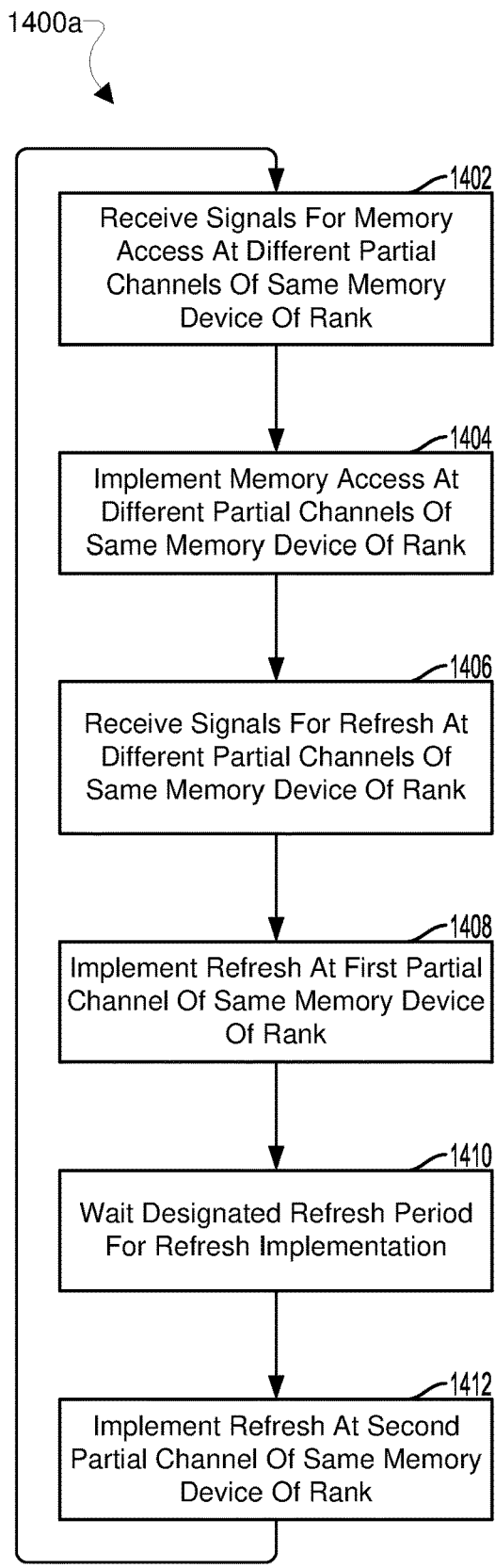
FIGS. 14A and 14B are process flow diagrams illustrating methods for implementing memory access and refresh using ranks or logical ranks in a memory system according to some embodiments.

FIGS. 14A and 14B illustrate methods for implementing memory access and refresh using ranks or logical ranks in a memory system according to some embodiments. With reference to FIGS. 1-14B, the methods 1400a, 1400b may be implemented in a computing device (e.g., computing device 10 in FIG. 1), in software executing in a processor (e.g., processor 14, 204a-204c in FIGS. 1 and 2), in general purpose hardware, in dedicated hardware (e.g., memory system 200, 300, 400 in FIGS. 2-4, memory 36 in FIG. 1, memory device 212a, 212b in FIG. 2, partial channel interface 214a, 214b, 302a, 302b, 304a, 304b in FIGS. 2-4), or in a combination of a software-configured processor and dedicated hardware, such as a processor executing software within a flexible memory rank control system that includes other individual components, and various memory/cache controllers. In order to encompass the alternative configurations enabled in various embodiments, the hardware implementing the methods 1400a, 1400b is referred to herein as a "flexible rank memory device."

In some embodiments, blocks 1402, 1404, 1406, 1408, 1410, 1412 of the method 1400a may be implemented at a single, same memory device (e.g., memory device 212a, 212b in FIG. 2), and blocks 1420, 1422, 1424, 1426 of the method 1400b may be implemented at multiple, different memory devices (e.g., memory devices 212a, 212b in FIG. 2).

With reference to FIG. 14A, in block 1402, the flexible rank memory device may receive signals for memory access at different partial channels of a same memory (e.g., memory device 212a, 212b in FIG. 2) of a rank (e.g., rank 314a, 314b in FIG. 3). The flexible rank memory device may receive signals, including command and address signals, data signals, etc., configured to cause the same memory to implement memory access at the components associated with the different partial channels of the same memory. A first signal may be configured to cause a first partial channel interface (e.g., partial channel interface 214a, 214b, 302a, 302b, 304a, 304b in FIGS. 2-4) of the same memory to implement memory access at the components associated with a first partial channel of the same memory. A second signal may be configured to cause a second partial channel interface (e.g., partial channel interface 214a, 214b, 302a, 302b, 304a, 304b in FIGS. 2-4) of the same memory to implement memory access at the components associated with a second partial channel of the same memory. The flexible rank memory device may receive the signals via a communication bus (e.g., sub-buses and lines 218a, 218b, 220a, 220b, 222a, 222b, 224a, 224b, 226a, 226b, 230 in FIG. 2, buses and lines 306a, 306b, 308a, 308b in FIGS. 3 and 4). The bus may be communicatively connected to the first partial channel interface of the same memory and may carry the first signal and may be communicatively connected to the second partial channel interface of the same memory and may carry the second signal. In some embodiments, the flexible rank memory device receiving the signals for memory access at the different partial channels of the same memory of the rank in block 1402 may be the same memory device, the first partial channel interface, and/or the second partial channel interface.

In block 1404, the flexible rank memory device may implement memory access at the different partial channels of the same memory of the rank. Implementing memory access at the first partial channel and the second partial channel may include known mechanisms for reading from and/or writing to the components associated with the first partial channel and the second partial channel. In some embodiments, the flexible rank memory device implementing memory access at the different partial channels of the same memory of the rank in block 1404 may be the same memory device, the first partial channel interface, and/or the second partial channel interface.

In block 1406, the flexible rank memory device may receive signals for refresh execution at the different partial channels of the same memory of the rank. The flexible rank memory device may receive signals, including refresh signals, configured to cause the same memory to implement refresh operations at the components associated with the different partial channels of the same memory. A first refresh signal may be configured to cause the first partial channel interface of the same memory to implement refresh operations at the components associated with the first partial channel of the same memory. A second refresh signal may be configured to cause the second partial channel interface of the same memory to implement memory access at the components associated with the second partial channel of the same memory. The flexible rank memory device may receive the signals via the communication bus. The bus may be communicatively connected to the first partial channel interface of the same memory and may carry the first refresh signal and may be communicatively connected to the second partial channel interface of the same memory and may carry the second refresh signal. The signals may be transmitted via the bus by a memory control device (e.g., memory controller 206, memory physical layer 208 in FIG. 2) communicatively connected to the bus. In some embodiments, the flexible rank memory device receiving the signals for refresh execution at the different partial channels of the same memory of the rank in block 1406 may be the same memory device, the first partial channel interface, and/or the second partial channel interface.

In block 1408, the flexible rank memory device may implement refresh operations at the first partial channel of the same memory of the rank. The resources of the flexible rank memory device for implementing refresh operations may be used at a limited number of partial channels of a same memory at a time, such as few as a single partial channel. The flexible rank memory device may be preconfigured with mechanisms for implementing refresh operations in an order for the partial channels, which may be static or dynamic based on one or more factors. For example, the flexible rank memory device may implement refresh operations at the first partial channel prior to the second partial channel of the same memory of the rank. In some embodiments, the flexible rank memory device implementing the refresh operations at the first partial channel of the same memory of the rank in block 1408 may be the same memory device and/or the first partial channel interface.

In block 1410, the flexible rank memory device may wait a designated refresh period (e.g., "tRFC" in FIG. 5A) for refresh implementation. Multiple partial channels of the same memory may have certain command timing constraints based on memory design and power distribution network limitations. For example, within the rank, executing a refresh operation of memory components of the first partial channel of the same memory may impose a timing constraint during which the same memory may not implement another refresh operation of memory components of another partial channel, such as the second partial channel, of the same memory. The designated period may be a period expressed in terms of any of various events, such as time, execution of operations, receipt of signals, etc. In some embodiments, the flexible rank memory device waiting the designated refresh period for refresh implementation in block 1410 may be the same memory device and/or the second partial channel interface.

In block 1412, the flexible rank memory device may implement refresh operations at the second partial channel of the same memory of the rank. Implementation of the refresh operations at the second partial channel of the same memory of the rank may occur following waiting the designated refresh period for refresh implementation in block 1410. As such, the implementation of the refresh operations at the first partial channel of the same memory of the rank in block 1408 may complete during the designated refresh period, freeing the resources of the flexible rank memory device for implementing refresh operations. The flexible rank memory device may implement the refresh operations at the second partial channel of the same memory of the rank serially to the implementation of the refresh operations at the first partial channel of the same memory of the rank in block 1408. In some embodiments, the flexible rank memory device implementing the refresh operations at the second partial channel of the same memory of the rank in block 1412 may be the same memory device and/or the first partial channel interface.

Following implementing the refresh operations at the second partial channel of the same memory of the rank in block 1412, the flexible rank memory device may again receive signals for memory access at the different partial channels of the same memory of the rank in block 1402.

With reference to FIG. 14B, in block 1420, the flexible rank memory device may receive signals for memory access at different partial channels of different memories (e.g., memory device 212a, 212b in FIG. 2) of a logical rank (e.g., logical rank 402a, 402b in FIG. 4). The flexible rank memory device may receive signals, including command and address signals, data signals, etc., configured to indicate to the different memories to implement memory access at the components associated with the different partial channels of the different memories. A first signal may indicate to a first partial channel interface (e.g., partial channel interface 214a, 214b, 302a, 302b, 304a, 304b in FIGS. 2-4) of a first memory (e.g., memory device 212a, 212b in FIG. 2) of the different memories to implement memory access at the components associated with a first partial channel of the first memory. A second signal may indicate to a second partial channel interface (e.g., partial channel interface 214a, 214b, 302a, 302b, 304a, 304b in FIGS. 2-4) of a second memory (e.g., memory device 212a, 212b in FIG. 2) of the different memories to implement memory access at the components associated with a second partial channel of the second memory. The flexible rank memory device may receive the signals via a communication bus (e.g., sub-buses and lines 218a, 218b, 220a, 220b, 222a, 222b, 224a, 224b, 226a, 226b, 230 in FIG. 2, buses and lines 306a, 306b, 308a, 308b in FIGS. 3 and 4). The bus may be communicatively connected to the first partial channel interface of the different memories and may carry the first signal and may be communicatively connected to the second partial channel interface of the different memories and may carry the second signal. In some embodiments, the flexible rank memory device receiving the signals for memory access at the different partial channels of the different memories of the logical rank in block 1420 may be the different memory devices, the first partial channel interface, and/or the second partial channel interface.

In block 1422, the flexible rank memory device may implement memory access at the different partial channels of the different memories of the logical rank. Implementing memory access at the first partial channel and the second partial channel may include known mechanisms for reading from and/or writing to the components associated with the first partial channel and the second partial channel. In some embodiments, the flexible rank memory device implementing memory access at the different partial channels of the different memories of the logical rank in block 1422 may be the different memory devices, the first partial channel interface, and/or the second partial channel interface.

In block 1424, the flexible rank memory device may receive signals for refresh execution at the different partial channels of the different memories of the logical rank. The flexible rank memory device may receive signals, including refresh signals, configured to indicate to the different memories to implement refresh operations at the components associated with the different partial channels of the different memories. A first refresh signal may indicate to the first partial channel interface of the first memory to implement refresh operations at the components associated with the first partial channel of the first memory. A second refresh signal may indicate to the second partial channel interface of the second memory to implement memory access at the components associated with the second partial channel of the second memory. The flexible rank memory device may receive the signals via the communication bus. The bus may be communicatively connected to the first partial channel interface of the first memory and may carry the first refresh signal and may be communicatively connected to the second partial channel interface of the second memory and may carry the second refresh signal. The signals may be transmitted via the bus by a memory control device (e.g., memory controller 206, memory physical layer 208 in FIG. 2) communicatively connected to the bus. In some embodiments, the flexible rank memory device receiving the signals for refresh execution at the different partial channels of the different memories of the logical rank in block 1424 may be the different memory devices, the first partial channel interface, and/or the second partial channel interface.

In block 1426, the flexible rank memory device may implement refresh operations at the different partial channels of the different memories of the logical rank in parallel. The resources of the flexible rank memory device for implementing refresh operations may be used at a limited number of partial channels of a memory at a time, such as few as a single partial channel. Such resources may be separate for each memory and the flexible rank memory device may implement refresh operations at different memories in parallel. In some embodiments, the flexible rank memory device implementing the refresh operations at the different partial channels of the different memories of the logical rank in parallel in block 1426 may be the different memory devices, the first partial channel interface, and/or the second partial channel interface.

Following implementing the refresh operations at the different partial channels of the different memories of the logical rank in parallel in block 1426, the flexible rank memory device may again receive signals for memory access at the different partial channels of the different memories of the logical rank in block 1420.

Figure 15:
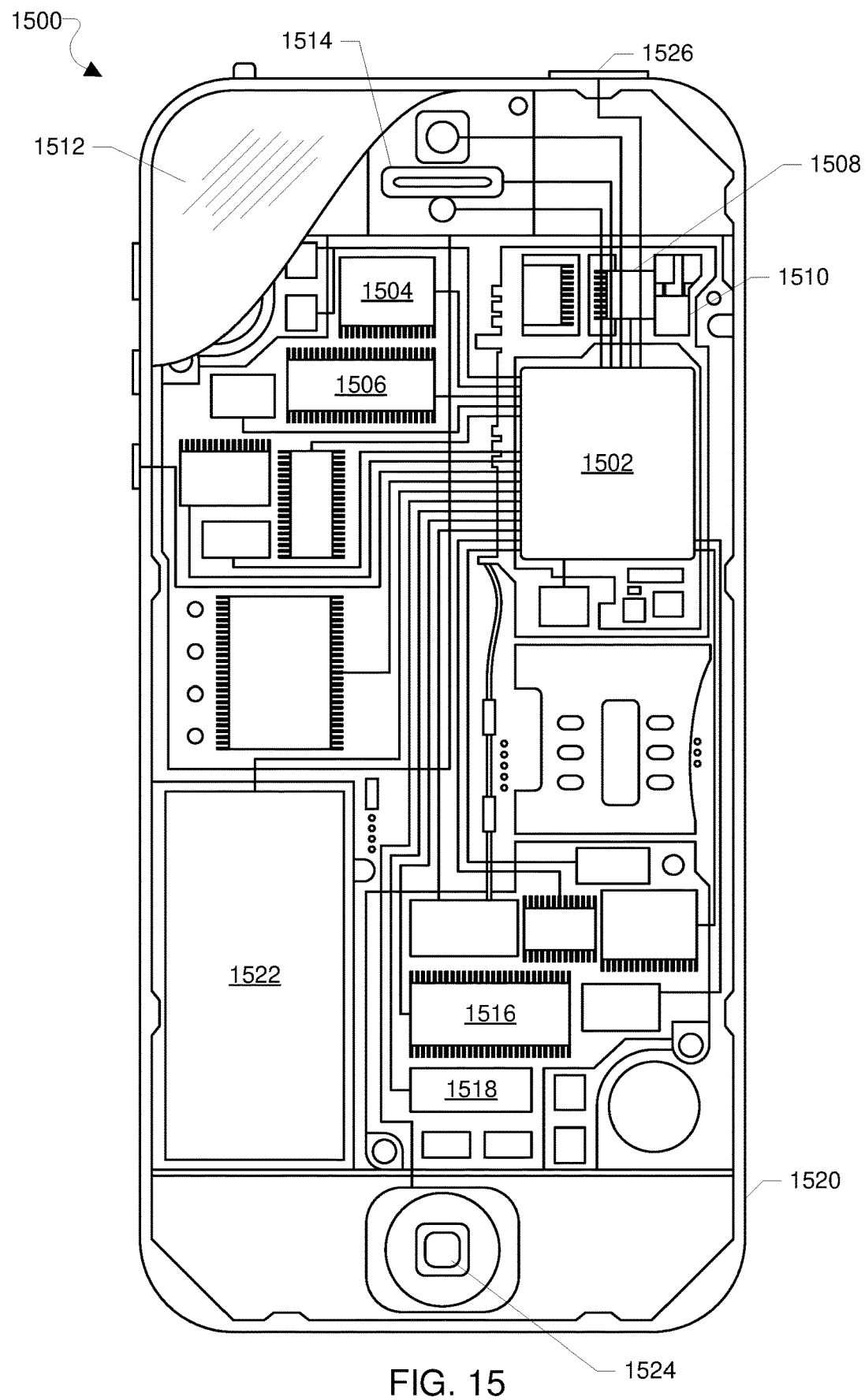
FIG. 15 is a component block diagram illustrating an example mobile computing device suitable for implementing various embodiments.

Various embodiments (including, but not limited to, embodiments described above with reference to FIGS. 1-14B) may be implemented in a wide variety of computing systems including mobile computing devices, an example of which suitable for use with the various embodiments is illustrated in FIG. 15. The mobile computing device 1500 may include a processor 1502 coupled to a touchscreen controller 1504 and an internal memory 1506. The processor 1502 may be one or more multicore integrated circuits designated for general or specific processing tasks. The internal memory 1506 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 1504 and the processor 1502 may also be coupled to a touchscreen panel 1512, such as a resistive-sensing touchscreen, capacitive-sensing touchscreen, infrared sensing touchscreen, etc. Additionally, the display of the mobile computing device 1500 need not have touch screen capability.

The mobile computing device 1500 may have one or more radio signal transceivers 1508 (e.g., Peanut, Bluetooth, ZigBee, Wi-Fi, RF radio) and antennae 1510, for sending and receiving communications, coupled to each other and/or to the processor 1502. The transceivers 1508 and antennae 1510 may be used with the above-mentioned circuitry to implement the various wireless transmission protocol stacks and interfaces. The mobile computing device 1500 may include a cellular network wireless modem chip 1516 that enables communication via a cellular network and is coupled to the processor.

The mobile computing device 1500 may include a peripheral device connection interface 1518 coupled to the processor 1502. The peripheral device connection interface 1518 may be singularly configured to accept one type of connection, or may be configured to accept various types of physical and communication connections, common or proprietary, such as Universal Serial Bus (USB), FireWire, Thunderbolt, or PCIe. The peripheral device connection interface 1518 may also be coupled to a similarly configured peripheral device connection port (not shown).

The mobile computing device 1500 may also include speakers 1514 for providing audio outputs. The mobile computing device 1500 may also include a housing 1520, constructed of a plastic, metal, or a combination of materials, for containing all or some of the components described herein. The mobile computing device 1500 may include a power source 1522 coupled to the processor 1502, such as a disposable or rechargeable battery. The rechargeable battery may also be coupled to the peripheral device connection port to receive a charging current from a source external to the mobile computing device 1500. The mobile computing device 1500 may also include a physical button 1524 for receiving user inputs. The mobile computing device 1500 may also include a power button 1526 for turning the mobile computing device 1500 on and off.

Figure 16:
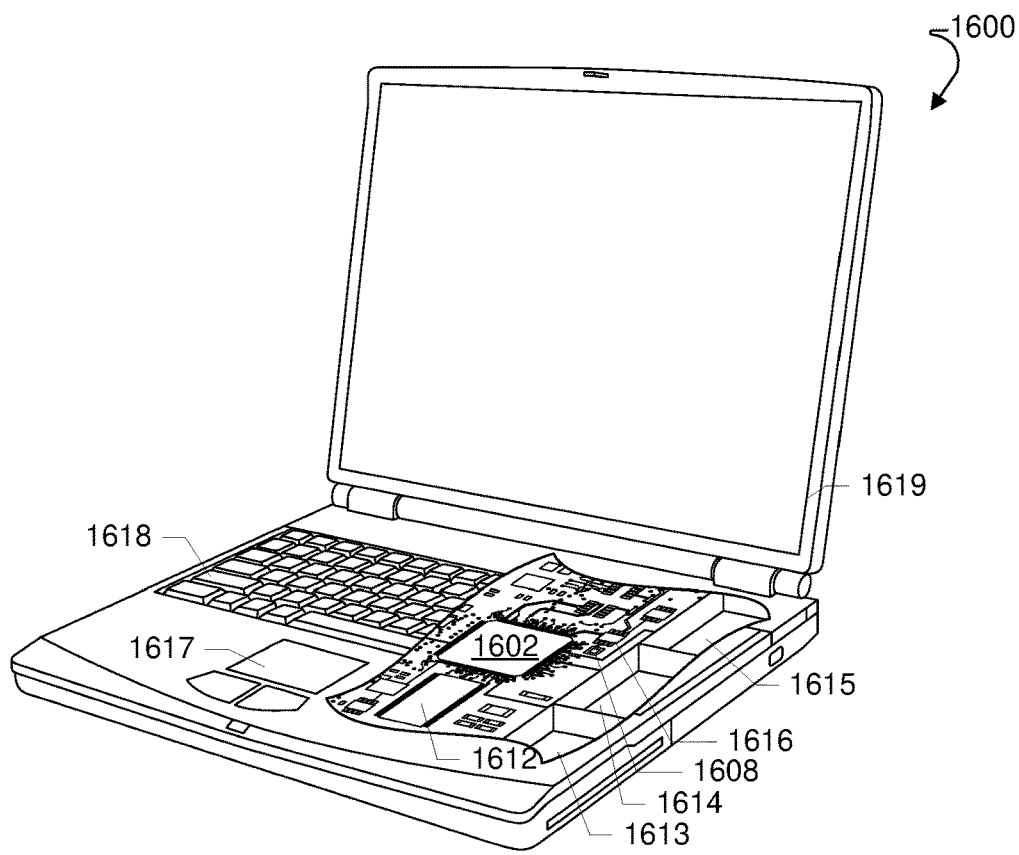
FIG. 16 is a component block diagram illustrating an example mobile computing device suitable for implementing various embodiments.

The various embodiments (including, but not limited to, embodiments described above with reference to FIGS. 1-14B) may be implemented in a wide variety of computing systems include a laptop computer 1600 an example of which is illustrated in FIG. 16. Many laptop computers include a touchpad touch surface 1617 that serves as the computer's pointing device, and thus may receive drag, scroll, and flick gestures similar to those implemented on computing devices equipped with a touch screen display and described above. A laptop computer 1600 will typically include a processor 1602 coupled to volatile memory 1612 and a large capacity nonvolatile memory, such as a disk drive 1613 of Flash memory. Additionally, the computer 1600 may have one or more antenna 1608 for sending and receiving electromagnetic radiation that may be connected to a wireless data link and/or cellular telephone transceiver 1616 coupled to the processor 1602. The computer 1600 may also include a floppy disc drive 1614 and a compact disc (CD) drive 1615 coupled to the processor 1602. In a notebook configuration, the computer housing includes the touchpad 1617, the keyboard 1618, and the display 1619 all coupled to the processor 1602. Other configurations of the computing device may include a computer mouse or trackball coupled to the processor (e.g., via a USB input) as are well known, which may also be used in conjunction with the various embodiments.

Figure 17:
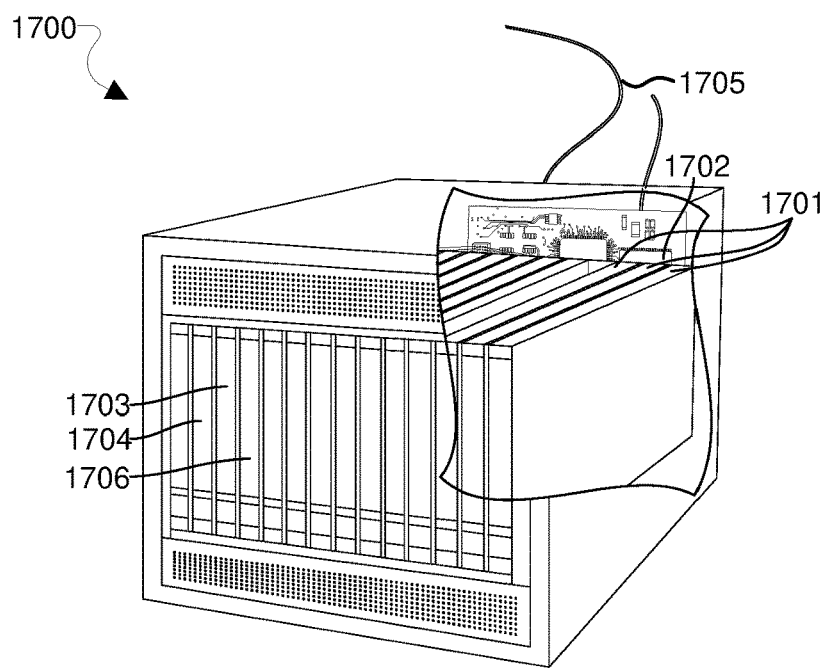
FIG. 17 is a component block diagram illustrating an example server suitable for implementing various embodiments.

The various embodiments (including, but not limited to, embodiments described above with reference to FIGS. 1-14B) may also be implemented in fixed computing systems, such as any of a variety of commercially available servers. An example server 1700 is illustrated in FIG. 17. Such a server 1700 typically includes one or more multicore processor assemblies 1701 coupled to volatile memory 1702 and a large capacity nonvolatile memory, such as a disk drive 1704. As illustrated in FIG. 17, multicore processor assemblies 1701 may be added to the server 1700 by inserting them into the racks of the assembly. The server 1700 may also include a floppy disc drive, compact disc (CD) or digital versatile disc (DVD) disc drive 1706 coupled to the processor 1701. The server 1700 may also include network access ports 1703 coupled to the multicore processor assemblies 1701 for establishing network interface connections with a network 1705, such as a local area network coupled to other broadcast system computers and servers, the Internet, the public switched telephone network, and/or a cellular data network (e.g., CDMA, TDMA, GSM, PCS, 3G, 4G, 5G, LTE, or any other type of cellular data network).

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

Implementation examples are described in the following paragraphs. While some of the following implementation examples are described in terms of an example computing device memory system, further example implementations may include: the example functions of the computing device memory system discussed in the following paragraphs implemented as methods of the following implementation examples; and the example computing device memory system discussed in the following paragraphs implemented by a computing device memory system including means for performing functions of the computing device memory system of the following implementation examples.

Example 1. A method implemented in a memory system, including: receiving, at a memory controller, a first memory access command and a first address at which to implement the first memory access command in a logical rank; generating, by the memory controller, a first signal configured to indicate to a first memory device of the logical rank to implement the first memory access command via a first partial channel; sending, from the memory controller, the first signal to the first memory device; generating, by the memory controller, a second signal configured to indicate to a second memory device of the logical rank that is different from the first memory device to implement the first memory access command via a second partial channel; and sending, from the memory controller, the second signal to the second memory device.

Example 2. The method of example 1, may further include: generating, by the memory controller, a third signal configured to indicate to the first memory device to activate components of the first memory device associated with the first partial channel; sending, from the memory controller, the third signal to the first memory device; generating, by the memory controller, a fourth signal configured to indicate to the second memory device to activate components of the first memory device associated with the second partial channel; and sending, from the memory controller, the fourth signal to the second memory device.

Example 3. The method of any of examples 1 and 2, may further include determining whether the first address at which to implement the first memory access command in the logical rank is at the logical rank, in which generating the first signal, sending the first signal, generating the second signal, and sending the second signal occur in response to determining that the first address at which to implement the first memory access command in the logical rank is at the logical rank.

Example 4. The method of any of examples 1-3, may further include: receiving, at the memory controller, a second memory access command and a second address at which to implement the second memory access command in a rank; generating, by the memory controller, a third signal configured to indicate to the first memory device of the rank to implement the second memory access command via the first partial channel; sending, from the memory controller, the third signal to the first memory device; generating, by the memory controller, a fourth signal configured to indicate to the first memory device of the rank to implement the second memory access command via the second partial channel; and sending, from the memory controller, the fourth signal to the first memory device.

Example 5. The method of example 4, may further include: determining whether the second address at which to implement the second memory access command in the rank is at a logical rank, in which generating the third signal, sending the third signal, generating the fourth signal; and sending the fourth signal occur in response to determining that the second address at which to implement the second memory access command in the rank is not at the logical rank.

Example 6. The method of either of examples 4 or 5, may further include: receiving, at a first partial channel interface of the first memory device for the first partial channel, the first signal; implementing, via the first partial channel, the first memory access command at the first memory device; receiving, at a second partial channel interface of the second memory device for the second partial channel, the second signal; and implementing, via the second partial channel, the second memory access command at the second memory device.

Example 7. The method of example 6, in which implementing the first memory access command at the first memory device and implementing the second memory access command at the second memory device include implementing the first memory access command at the first memory device and implementing the second memory access command at the second memory device in parallel.

Example 8. A method implemented in a memory system, includes: receiving, at a first partial channel interface of a first memory device for a first partial channel, a first refresh signal; receiving, at a second partial channel interface of a second memory device for a second partial channel, a second refresh signal; implementing, via the first partial channel, a refresh operation at the first memory device in response to the first refresh signal; and implementing, via the second partial channel, a refresh operation at the second memory device in response to the second refresh signal.

Example 9. The method of example 8, in which the first memory device and the second memory device are different memory devices of a logical rank, and implementing the refresh operation at the second memory device includes implementing the refresh operation at the second memory device in parallel with implementing the refresh operation at the first memory device.

Example 10. The method of example 9, further including receiving, at the first partial channel interface, a first signal configured to cause the first memory device of the logical rank to implement a first memory access command via the first partial channel; receiving, at the second partial channel interface, a second signal configured to cause the second memory device of the logical rank to implement a second memory access command via the second partial channel; implementing, via the first partial channel, the first memory access command at the first memory device following implementing the refresh operation at the second memory device in parallel with implementing the refresh operation at the first memory device; and implementing, via the second partial channel, the second memory access command at the second memory device following implementing the refresh operation at the second memory device in parallel with implementing the refresh operation at the first memory device.

Example 11. The method of any of examples 8-10, in which the second memory device is the first memory device, the method further including waiting a designated refresh period for the refresh operation at the first memory device, in which implementing the refresh operation at the second memory device includes implementing the refresh operation at the second memory device following the designated refresh period.

Example 12. The method of example 11, further including receiving, at the first partial channel interface, a first signal configured to cause the first memory device to implement a first memory access command via the first partial channel; receiving, at the second partial channel interface, a second signal configured to cause the second memory device to implement a second memory access command via the second partial channel; implementing, via the first partial channel, the first memory access command at the first memory device following implementing the refresh operation at the second memory device following the designated refresh period; and implementing, via the second partial channel, the second memory access command at the second memory device following implementing the refresh operation at the second memory device following the designated refresh period.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method implemented in a memory system, comprising:
   receiving, at a memory controller, a first memory access command and a first address at which to implement the first memory access command in a logical rank;
   generating, by the memory controller, a first signal configured to indicate to a first memory device of the logical rank to implement the first memory access command via a first partial channel;
   sending, from the memory controller, the first signal to the first memory device;
   generating, by the memory controller, a second signal configured to indicate to a second memory device of the logical rank that is different from the first memory device to implement the first memory access command via a second partial channel; and
   sending, from the memory controller, the second signal to the second memory device; and
   determining whether the first address at which to implement the first memory access command in the logical rank is at the logical rank,
   wherein generating the first signal, sending the first signal, generating the second signal, and sending the second signal occur in response to determining that the first address at which to implement the first memory access command in the logical rank is at the logical rank.

2. The method of claim 1, further comprising:
   generating, by the memory controller, a third signal configured to indicate to the first memory device to activate components of the first memory device associated with the first partial channel;
   sending, from the memory controller, the third signal to the first memory device;
   generating, by the memory controller, a fourth signal configured to indicate to the second memory device to activate components of the first memory device associated with the second partial channel; and
   sending, from the memory controller, the fourth signal to the second memory device.

3. The method of claim 1, further comprising:
   receiving, at the memory controller, a second memory access command and a second address at which to implement the second memory access command in a rank;
   generating, by the memory controller, a third signal configured to indicate to the first memory device of the rank to implement the second memory access command via the first partial channel;
   sending, from the memory controller, the third signal to the first memory device;
   generating, by the memory controller, a fourth signal configured to indicate to the first memory device of the rank to implement the second memory access command via the second partial channel; and
   sending, from the memory controller, the fourth signal to the first memory device.

4. The method of claim 3, further comprising determining whether the second address at which to implement the second memory access command in the rank is at the logical rank,
   wherein generating the third signal, sending the third signal, generating the fourth signal, and sending the fourth signal occur in response to determining that the second address at which to implement the second memory access command in the rank is not at the logical rank.

5. The method of claim 3, further comprising:
   receiving, at a first partial channel interface of the first memory device for the first partial channel, the first signal;
   implementing, via the first partial channel, the first memory access command at the first memory device;
   receiving, at a second partial channel interface of the second memory device for the second partial channel, the second signal; and implementing, via the second partial channel, the second memory access command at the second memory device.

6. The method of claim 5, wherein implementing the first memory access command at the first memory device and implementing the second memory access command at the second memory device comprise implementing the first memory access command at the first memory device and implementing the second memory access command at the second memory device in parallel.

7. A computing device, comprising:
a first memory device;
a second memory device; and
a memory controller communicatively connected to the first memory device and the second memory device, and configured to:
receive a first memory access command and a first address at which to implement the first memory access command in a logical rank;
generate a first signal configured to indicate to the first memory device of the logical rank to implement the first memory access command via a first partial channel;
send the first signal to the first memory device;
generate a second signal configured to indicate to the second memory device of the logical rank that is different from the first memory device to implement the first memory access command via a second partial channel; and
send the second signal to the second memory device.

8. The computing device of claim 7, wherein the memory controller is further configured to:
generate a third signal configured to indicate to the first memory device to activate components of the first memory device associated with the first partial channel;
send the third signal to the first memory device;
generate a fourth signal configured to indicate to the second memory device to activate components of the first memory device associated with the second partial channel; and
send the fourth signal to the second memory device.

9. The computing device of claim 7, wherein the memory controller is further configured to:
receive a second memory access command and a second address at which to implement the second memory access command in a rank;
generate a third signal configured to indicate to the first memory device of the rank to implement the second memory access command via the first partial channel;
send the third signal to the first memory device;
generate a fourth signal configured to indicate to the first memory device of the rank to implement the second memory access command via the second partial channel; and
send the fourth signal to the first memory device.

10. The computing device of claim 9, wherein the memory controller is further configured to:
determine whether the second address at which to implement the second memory access command in the rank is at the logical rank; and
generate the third signal, send the third signal, generate the fourth signal, and send the fourth signal in response to determining that the second address at which to implement the second memory access command in the rank is not at the logical rank.

11. The computing device of claim 9, wherein:
the first memory device is configured to:
receive, at a first partial channel interface of the first memory device for the first partial channel, the first signal; and
implement, by the first partial channel, the first memory access command at the first memory device; and
the second memory device is configured to:
receive, at a second partial channel interface of the second memory device for the second partial channel, the second signal; and
implement, by the second partial channel, the second memory access command at the second memory device.

12. The computing device of claim 11, wherein the first memory device is configured to implement the first memory access command at the first memory device in parallel with implementing the second memory access command at the second memory device.

13. A computing device, comprising:
means for receiving a first memory access command and a first address at which to implement the first memory access command in a logical rank;
means for generating a first signal configured to indicate to a first memory device of the logical rank to implement the first memory access command via a first partial channel;
means for sending the first signal to the first memory device;
means for generating a second signal configured to indicate to a second memory device of the logical rank that is different from the first memory device to implement the first memory access command via a second partial channel;
means for sending the second signal to the second memory device; and
means for determining whether the first address at which to implement the first memory access command in the logical rank is at the logical rank,
wherein means for generating the first signal, means for sending the first signal, means for generating the second signal, and means for sending the second signal are implemented in response to determining that the first address at which to implement the first memory access command in the logical rank is at the logical rank.

14. The computing device of claim 13, further comprising:
means for generating a third signal configured to indicate to the first memory device to activate components of the first memory device associated with the first partial channel;
means for sending the third signal to the first memory device;
means for generating a fourth signal configured to indicate to the second memory device to activate components of the first memory device associated with the second partial channel; and
means for sending the fourth signal to the second memory device.

15. The computing device of claim 13, further comprising:
means for receiving a second memory access command and a second address at which to implement the second memory access command in a rank;

means for generating a third signal configured to indicate to the first memory device of the rank to implement the second memory access command via the first partial channel;
means for sending the third signal to the first memory device;
means for generating a fourth signal configured to indicate to the first memory device of the rank to implement the second memory access command via the second partial channel; and
means for sending the fourth signal to the first memory device.

16. The computing device of claim 15, further comprising means for determining whether the second address at which to implement the second memory access command in the rank is at a logical rank,
wherein means for generating the third signal, means for sending the third signal, means for generating the fourth signal, and means for sending the fourth signal are implemented in response to determining that the second address at which to implement the second memory access command in the rank is not at the logical rank.

17. The computing device of claim 15, further comprising:
means for means for receiving the first signal;
means for implementing the first memory access command at the first memory device via the first partial channel;
means for receiving the second signal; and
means for implementing the second memory access command at the second memory device via the second partial channel.

18. The computing device of claim 17, further comprising means for implementing the first memory access command at the first memory device and implementing the second memory access command at the second memory device in parallel.

19. A memory controller configured to:
receive a first memory access command and a first address at which to implement the first memory access command in a logical rank;
generate a first signal configured to indicate to a first memory device of the logical rank to implement the first memory access command via a first partial channel;
send the first signal to the first memory device;
generate a second signal configured to indicate to a second memory device of the logical rank that is different from the first memory device to implement the first memory access command via a second partial channel; and
send the second signal to the second memory device; and
determine whether the first address at which to implement the first memory access command in the logical rank is at the logical rank; and
generate the first signal, sending the first signal, generate the second signal, and send the second signal occur in response to determining that the first address at which to implement the first memory access command in the logical rank is at the logical rank.

20. The memory controller of claim 19, wherein the memory controller is further configured to:
generate a third signal configured to indicate to the first memory device to activate components of the first memory device associated with the first partial channel;
send the third signal to the first memory device;
generate a fourth signal configured to indicate to the second memory device to activate components of the first memory device associated with the second partial channel;
send the fourth signal to the second memory device.

21. The memory controller of claim 19, wherein the memory controller is further configured to:
receive a second memory access command and a second address at which to implement the second memory access command in a rank;
generate a third signal configured to indicate to the first memory device of the rank to implement the second memory access command via the first partial channel;
send the third signal to the first memory device;
generate a fourth signal configured to indicate to the first memory device of the rank to implement the second memory access command via the second partial channel; and
send the fourth signal to the first memory device.

22. The memory controller of claim 21, wherein the memory controller is further configured to:
determine whether the second address at which to implement the second memory access command in the rank is at the logical rank; and
generate the third signal, send the third signal, generate the fourth signal, and send the fourth signal in response to determining that the second address at which to implement the second memory access command in the rank is not at the logical rank.

23. A method implemented in a memory system, comprising:
receiving, at a first partial channel interface of a first memory device for a first partial channel, a first refresh signal;
receiving, at a second partial channel interface of a second memory device for a second partial channel, a second refresh signal;
implementing, via the first partial channel, a refresh operation at the first memory device in response to the first refresh signal; and
implementing, via the second partial channel, a refresh operation at the second memory device in response to the second refresh signal.

24. The method of claim 23, wherein the first memory device and the second memory device are different memory devices of a logical rank, and implementing the refresh operation at the second memory device comprises implementing the refresh operation at the second memory device in parallel with implementing the refresh operation at the first memory device.

25. The method of claim 24, further comprising:
receiving, at the first partial channel interface, a first signal configured to cause the first memory device of the logical rank to implement a first memory access command via the first partial channel;
receiving, at the second partial channel interface, a second signal configured to cause the second memory device of the logical rank to implement a second memory access command via the second partial channel;
implementing, via the first partial channel, the first memory access command at the first memory device following implementing the refresh operation at the second memory device in parallel with implementing the refresh operation at the first memory device; and
implementing, via the second partial channel, the second memory access command at the second memory device following implementing the refresh operation at the second memory device in parallel with implementing the refresh operation at the first memory device.

26. The method of claim 23, wherein the second memory device is the first memory device, the method further comprising:
waiting a designated refresh period for the refresh operation at the first memory device, wherein implementing the refresh operation at the second memory device comprises implementing the refresh operation at the second memory device following the designated refresh period.

27. The method of claim 25, further comprising:
receiving, at the first partial channel interface, a first signal configured to cause the first memory device to implement a first memory access command via the first partial channel;
receiving, at the second partial channel interface, a second signal configured to cause the second memory device to implement a second memory access command via the second partial channel;
implementing, via the first partial channel, the first memory access command at the first memory device following implementing the refresh operation at the second memory device following the designated refresh period; and
implementing, via the second partial channel, the second memory access command at the second memory device following implementing the refresh operation at the second memory device following the designated refresh period.

* * * * *